US011662394B2

(12) United States Patent
Curtis et al.

(10) Patent No.: US 11,662,394 B2
(45) Date of Patent: May 30, 2023

(54) GROUND MONITOR WITH SMART FREQUENCY SELECTION

(71) Applicant: Intermountain Electronics, Inc., Price, UT (US)

(72) Inventors: Dale V. Curtis, Castle Dale, UT (US); Robin Vice, Phoenix, AZ (US)

(73) Assignee: Intermountain Electronics, Inc., Price, UT (US)

( * ) Notice: Subject to any disclaimer, the term of this patent is extended or adjusted under 35 U.S.C. 154(b) by 309 days.

(21) Appl. No.: 16/983,908

(22) Filed: Aug. 3, 2020

(65) Prior Publication Data
US 2021/0063495 A1 Mar. 4, 2021

Related U.S. Application Data

(60) Provisional application No. 62/892,442, filed on Aug. 27, 2019.

(51) Int. Cl.
| | | |
|---|---|---|
| *G01R 31/54* | (2020.01) | |
| *G01R 17/02* | (2006.01) | |
| *H02H 5/10* | (2006.01) | |
| *G01R 31/28* | (2006.01) | |

(52) U.S. Cl.
CPC .............. *G01R 31/54* (2020.01); *G01R 17/02* (2013.01); *H02H 5/105* (2013.01); *G01R 31/2837* (2013.01)

(58) Field of Classification Search
CPC .... G01R 31/54; G01R 17/02; G01R 31/2837; H02H 5/105
See application file for complete search history.

(56) References Cited

U.S. PATENT DOCUMENTS

| | | |
|---|---|---|
| 9,124,089 B2 | 9/2015 | Curtis et al. |
| 9,172,234 B2 | 10/2015 | Curtis et al. |
| 9,197,055 B2 | 11/2015 | Curtis et al. |
| 9,541,594 B2 | 1/2017 | Curtis |
| 9,541,595 B2 | 1/2017 | Curtis |
| 9,541,596 B2 | 1/2017 | Curtis |
| 9,547,032 B2 | 1/2017 | Curtis |
| 9,645,184 B2 | 5/2017 | Curtis |
| 10,141,142 B2 | 11/2018 | Curtis |
| 2015/0346263 A1* | 12/2015 | Curtis .................... G01R 31/52 324/509 |
| 2017/0138991 A1* | 5/2017 | Curtis .................... G01R 31/52 |

FOREIGN PATENT DOCUMENTS

CA 3022248 A1 * 4/2019 ........... G01R 31/025

* cited by examiner

*Primary Examiner* — Daniel R Miller
(74) *Attorney, Agent, or Firm* — Kunzler Bean & Adamson; Bruce R. Needham

(57) ABSTRACT

An apparatus for smart frequency selection in a ground monitor apparatus is disclosed. The apparatus includes an energy measurement circuit that measures an energy level at a test frequency in an equipment grounding conductor between a load and a power source and an energy comparator that compares the measured energy level with an energy threshold. The apparatus includes a continuity signal circuit that injects a continuity signal with a frequency at the test frequency in the equipment grounding conductor at an energy level above the energy threshold in response to the energy comparator determining that the measured energy level is below the energy threshold. The continuity signal is an indicator for continuity of the equipment grounding conductor between the power source and load.

17 Claims, 9 Drawing Sheets

GROUND MONITOR WITH SMART FREQUENCY SELECTION

CROSS-REFERENCES TO RELATED APPLICATIONS

This application claims the benefit of, U.S. Provisional Patent Application No. 62/892,442 entitled "GROUND MONITOR WITH SMART FREQUENCY SELECTION" and filed on Aug. 27, 2019 for Dale V. Curtis, et al., which is incorporated herein by reference.

FIELD

This invention relates to ground monitors and more particularly relates to smart frequency selection for a ground monitor.

BACKGROUND

Mining is a very special environment that is by its very nature hazardous. Mine shafts are very limited physically, often include wet conditions, and can have explosive gases and dust. The mining industry has a long history of accidents and fatalities. As a result, governmental regulations as well as company policies are geared toward making mining safer for those that enter and work in mines. One governmental agency that regulates mining practice in the United States is the Mine Safety and Health Administration ("MSHA"). MSHA provides regulations as well as enforcement of the regulations. Other countries have similar organizations.

Mining equipment is typically large and requires a significant amount of power. Mining equipment is also typically portable. To provide power to the mining equipment, portable power sources are provided in and around mines. Due to the high power requirements of mining equipment as well as mines having long shafts, often mining power source have voltages that are higher than are typically found in industrial situations. It is not uncommon for the mining power sources to provide power with voltages being about 1 kilo volt ("KV"). In addition, due to the portability of the mining equipment and power sources, often power is provided using flexible cables run without conduit. Due to the high voltages, exposed cables, wet conditions, etc., special consideration must be made for safety of the electrical power systems in mining.

One way to increase safety and reliability of mining power systems is to determine if equipment grounding conductors are in place and properly connected. When equipment grounding conductors are not properly connected, have short circuits, etc., when a fault condition occurs electrical current can flow through the earth surrounding mine shafts as well as through mining equipment. Current flowing in unintended routes create a shock hazard for miners both for fault conditions before overcurrent protection reacts as well as steady state conditions when continuous current flow in unintended paths.

SUMMARY

An apparatus for smart frequency selection in a ground monitor apparatus is disclosed. The apparatus includes an energy measurement circuit that measures an energy level at a test frequency in an equipment grounding conductor between a load and a power source and an energy comparator that compares the measured energy level with an energy threshold. The apparatus includes a continuity signal circuit that injects a continuity signal with a frequency at the test frequency in the equipment grounding conductor at an energy level above the energy threshold in response to the energy comparator determining that the measured energy level is below the energy threshold. The continuity signal is an indicator for continuity of the equipment grounding conductor between the power source and load.

Another apparatus for smart frequency selection in a ground monitor apparatus includes a frequency selector that selects a test frequency, where the test frequency is selected from frequencies within a test frequency range and the test frequency range is above a fundamental frequency of a power source and excludes harmonics of the fundamental frequency. The apparatus includes an energy measurement circuit that measures an energy level at the test frequency in an equipment grounding conductor between a load and the power source and an energy comparator that compares the measured energy level with an energy threshold. The apparatus includes a continuity signal circuit that injects a continuity signal with a frequency at the test frequency in the equipment grounding conductor at an energy level above the energy threshold in response to the energy comparator determining that the measured energy level is below the energy threshold, wherein the continuity signal is an indicator for continuity of the equipment grounding conductor between the power source and load.

A method smart frequency selection in a ground monitor apparatus includes measuring an energy level at a test frequency in an equipment grounding conductor between a load and a power source, comparing the measured energy level with an energy threshold, and injecting a continuity signal with a frequency at the test frequency in the equipment grounding conductor at an energy level above the energy threshold in response to determining that the measured energy level is below the energy threshold. The continuity signal is an indicator for continuity of the equipment grounding conductor between the power source and load.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1A:
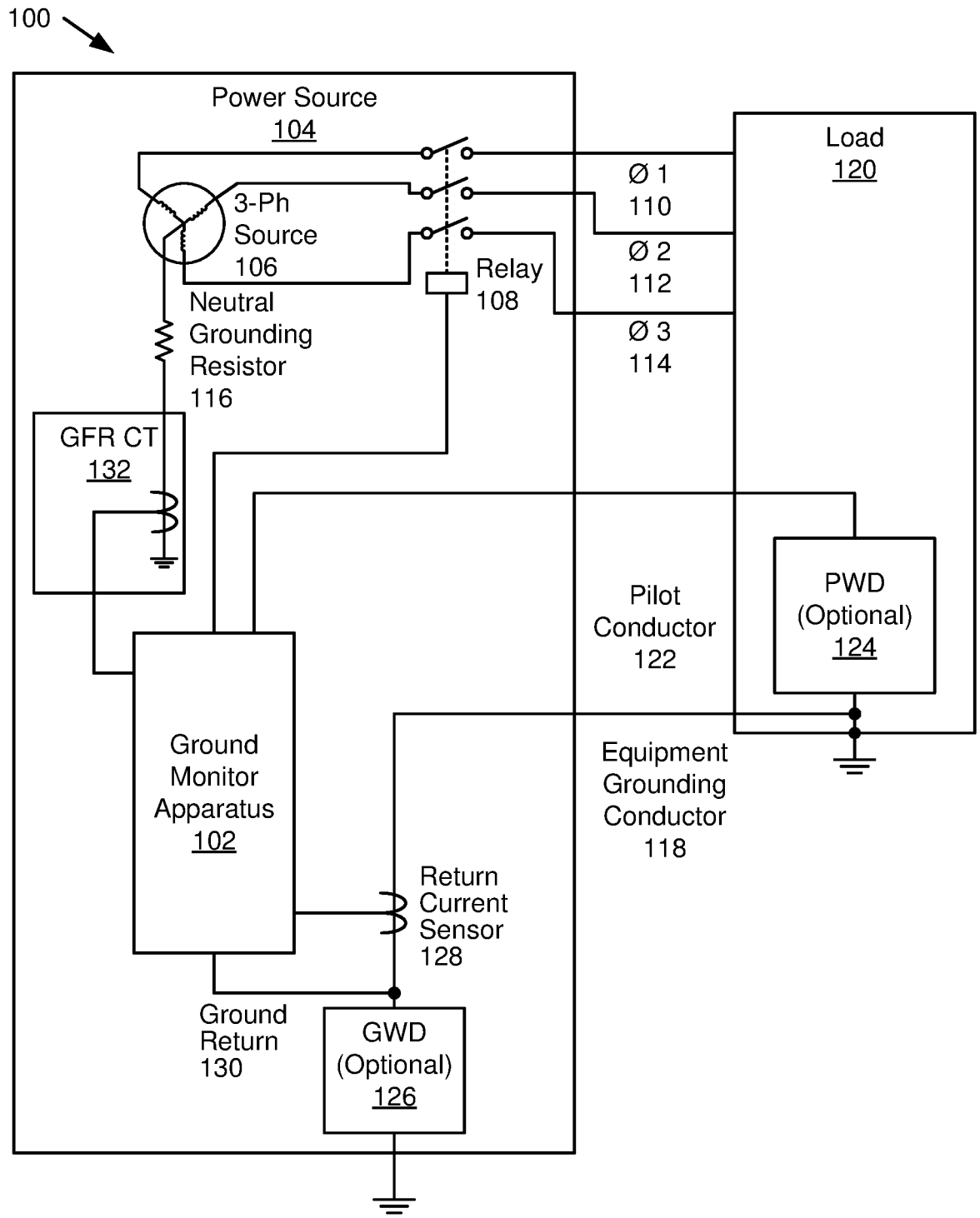
FIG. 1A is a schematic block diagram illustrating one embodiment of a system with a ground monitor apparatus that injects a continuity signal in an equipment grounding conductor over a pilot conductor.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable storage medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture ("ISA") instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). In some embodiments, electronic circuitry including, for example, programmable logic circuitry, field-programmable gate arrays ("FPGA"), or programmable logic arrays ("PLA") may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program instructions may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C. As used herein, "a member selected from the group consisting of A, B, and C," includes one and only one of A, B, or C, and excludes combinations of A, B, and C." As used herein, "a member selected from the group consisting of A, B, and C and combinations thereof" includes only A, only B, only C, a combination of A and B, a combination of B and C, a combination of A and C or a combination of A, B and C.

An apparatus for smart frequency selection in a ground monitor apparatus is disclosed. The apparatus includes an energy measurement circuit that measures an energy level at a test frequency in an equipment grounding conductor between a load and a power source and an energy comparator that compares the measured energy level with an energy threshold. The apparatus includes a continuity signal circuit that injects a continuity signal with a frequency at the test frequency in the equipment grounding conductor at an energy level above the energy threshold in response to the energy comparator determining that the measured energy level is below the energy threshold. The continuity signal is an indicator for continuity of the equipment grounding conductor between the power source and load.

In some embodiments, the apparatus includes a frequency selector that selects the test frequency. The test frequency is selected from frequencies within a test frequency range. In other embodiments, the frequency selector selects an alternate test frequency in response to the energy comparator determining that the measured energy is not below the energy threshold.

In a further embodiment, the energy measurement circuit measures an energy level in the equipment grounding conductor at the alternate test frequency, the energy comparator compares the measured energy level for the alternate test frequency with the energy threshold, and the continuity signal circuit injects a continuity signal with a frequency at the alternate test frequency in the equipment grounding conductor at an energy level above the energy threshold in response to the energy comparator determining that the measured energy level is below the energy threshold. In another further embodiment, the frequency selector, the energy measurement circuit and the energy comparator select test frequencies, measure energy levels at the test frequencies and compare the measured energy levels with the energy threshold until the energy comparator determines that a test frequency is below the energy threshold or the frequency selector reaches a frequency limit where the frequency limit includes a number of times the frequency selector selects a test frequency.

In some embodiments, the energy measurement circuit measures an energy level by measuring a current and/or a voltage. In other embodiments, the continuity signal circuit injects a plurality of continuity signals into the equipment grounding conductor where the frequency selector selects each test frequency and each test frequency is a different frequency. In other embodiments, the frequency selector selects a test frequency for each continuity signal from a different test frequency range, where each test frequency range does not overlap another test frequency range. In other embodiments, the energy measurement circuit interrupts a first continuity signal and measures the energy level at a first test frequency for the first continuity signal while one or more additional continuity signals at different test frequencies are injected in the equipment grounding conductor.

In other embodiments, during a startup operation, for each of the plurality of continuity signals and until a suitable test frequency is found, the energy measurement circuit measures an energy level in the equipment grounding conductor at a test frequency selected by the frequency selector within a test frequency range, the energy comparator compares the measured energy level for the test frequency with the energy threshold, the continuity signal circuit injects a continuity signal with a frequency at the test frequency in the equipment grounding conductor at an energy level above the energy threshold in response to the energy comparator determining that the measured energy level is below the energy threshold, and the frequency selector selects a different test frequency within the test frequency range in response to the energy comparator determining that the measured energy level is at or below the energy threshold.

In some embodiments, the frequency selector selects the test frequency from a group of pre-selected test frequencies within the test frequency range or selects the test frequency using a random frequency generator configured to select a random test frequency within the test frequency range. In other embodiments, the apparatus includes a continuity signal measurement circuit that measures an energy level at the test frequency in the equipment grounding conductor while the continuity signal circuit injects the continuity signal in the equipment grounding conductor and a signal strength comparator that compares the measured energy level measured by the energy measurement circuit with the measured energy level measured by the continuity signal measurement circuit. In the embodiment, the continuity signal circuit injects the continuity signal with the frequency at the test frequency in the equipment grounding conductor at an energy level above the energy threshold in response to the energy comparator determining that the measured energy level is below the energy threshold and the signal strength comparator determining that an energy difference between the measured energy level measured by the energy measurement circuit and the measured energy level measured by the continuity signal measurement circuit is above a signal strength delta threshold.

In some embodiments, the continuity signal circuit does not inject the continuity signal in the equipment grounding conductor while the energy measurement circuit measures the energy level at the test frequency. In other embodiments, the energy measurement circuit includes a band pass filter tuned to the test frequency. In other embodiments, the continuity signal circuit injects the continuity signal in a pilot conductor and the equipment grounding conductor run to the load and the continuity signal is injected into the equipment grounding conductor from the pilot conductor. In other embodiments, the continuity signal circuit injects the continuity signal in a phase conductor providing power to the load and the continuity signal is injected into the equipment grounding conductor from the phase conductor.

Another apparatus for smart frequency selection in a ground monitor apparatus includes a frequency selector that selects a test frequency, where the test frequency is selected from frequencies within a test frequency range. The apparatus includes an energy measurement circuit that measures an energy level at the test frequency in an equipment grounding conductor between a load and the power source and an energy comparator that compares the measured energy level with an energy threshold. The apparatus includes a continuity signal circuit that injects a continuity signal with a frequency at the test frequency in the equipment grounding conductor at an energy level above the energy threshold in response to the energy comparator determining that the measured energy level is below the energy threshold, wherein the continuity signal is an indicator for continuity of the equipment grounding conductor between the power source and load.

In some embodiments, the frequency selects an alternate test frequency in response to the energy comparator determining that the measured energy is not below the energy threshold, where the energy measurement circuit measures an energy level, the energy comparator compares the measured energy level with the energy threshold for the alternate test frequency and the continuity signal circuit injects a continuity signal comprising the alternate test signal in response to the energy comparator determining that the measured energy level for the alternate test frequency is below the energy threshold. In other embodiments, the continuity signal circuit injects a plurality of continuity signals into the equipment grounding conductor where the frequency selector selects each test frequency and each test frequency is a different frequency.

A method smart for frequency selection in a ground monitor apparatus includes measuring an energy level at a test frequency in an equipment grounding conductor between a load and a power source, comparing the measured energy level with an energy threshold, and injecting a continuity signal with a frequency at the test frequency in the equipment grounding conductor at an energy level above the energy threshold in response to determining that the measured energy level is below the energy threshold. The continuity signal is an indicator for continuity of the equipment grounding conductor between the power source and load.

In some embodiments, the method includes selecting the test frequency. The test frequency is selected from frequencies within a test frequency range. In some embodiments, the test frequency range is above a fundamental frequency of the power source and excludes harmonics of the fundamental frequency.

FIG. 1A is a schematic block diagram illustrating one embodiment of a system 100 with a ground monitor apparatus 102 that injects a continuity signal in an equipment grounding conductor 118 over a pilot conductor 122. The system 100 includes a ground monitor apparatus 102, a power source 104, a three-phase power source 106, a relay 108, a first phase 110, a second phase 112, a third phase 114, a neutral grounding resistor 116, an equipment grounding conductor 118, a load 120 with a pilot wire device ("PWD") 124, a pilot conductor 122, a ground wire device ("GWD") 126 a return current sensor 128, a ground return 130 and a ground fault relay ("GFR") current transformer ("CT") 132, which are described below.

The system 100 includes, in one embodiment, a ground monitor apparatus 102 that monitors current in the equipment grounding conductor 118, and is described in more detail with regard to the apparatuses 200, 201, 300, 400 of FIGS. 2A, 2B, 3 and 4. The power source 104, in one embodiment, includes a three-phase power source 106. In one example, the three-phase power source 106 is a wye-connected source. The three-phase power source 106, in one example, is grounded through a neutral grounding resistor 116. In another embodiment, the three-phase power source 106 may be a delta-connected power source. In another embodiment, the power source 104 includes another type of power source, such as a single-phase power source or a direct current ("DC") power source. The three-phase power source 106 may include some type of a generator, or maybe wired to another source (not shown), such as a utility power source. In another embodiment, the power source 104 may include multiple power sources. In a particular embodiment, the power source 104 may be configured for an application in a mine. The power source 104, in one embodiment, is configured for mining applications and in another embodiment is configured to meet requirements of the Mine Safety and Health Administration ("MSHA"). One of skill in the art will recognize other power sources 104 that include a ground monitor apparatus 102.

In one embodiment, the power source 104 includes a relay 108. As used herein, contact and relay are used interchangeably. The relay 108 may include a contact that may be normally open or normally closed and closing or opening the contact may open the relay 108. In one example, the relay 108 is a three-phase contactor. In another example, the relay 108 is a circuit breaker with the remote trip. The relay 108 includes a capability to be commanded open by the ground monitor apparatus 102. The relay 108 may include a fault detection module (not shown) that sends a trip signal to the relay 108 on detection of an overcurrent condition. For example, a fault detection module may include current sensing and/or voltage sensing circuits may indicate an overcurrent or fault condition. The fault detection module may have an inverse time characteristic or other common protective relaying characteristic and may coordinate with other overcurrent protection devices upstream and downstream. The relay 108 may also be opened for other conditions, such as a manual command to open.

In one example, the relay 108 also includes the capability to be commanded open by the ground monitor apparatus 102. For example, the ground monitor apparatus 102 may send a command to open the relay 108 upon detection of a ground problem. In another embodiment, or the power source 104 includes a different type of power source, such as a single phase source, the relay 108 may include a different number of poles. In another example, the relay 108 may be a three-pole contactor. One of skill in the art will recognize other types of relays 108 that may be used in conjunction with the power source 104 that includes a ground monitor apparatus 102.

In one embodiment, the system 100 includes a set of power cables wired to a load 120 with a first phase 110, a second phase 112, a third phase 114, and an equipment grounding conductor 118. In other embodiments, the set of power cables may include a neutral conductor (grounded conductor) wired to the load and/or the pilot conductor 122. For safety, it is desirable to determine if the equipment grounding conductor 118 is properly connected between the power source 104 and the load 120. For example, if the equipment grounding conductor 118 is disconnected, has failed, or in some way is not properly connected between the power source 104 and the load 120, a hidden danger may exist within the system 100. For instance, if a short circuit occurs and the equipment grounding conductor 118 is not properly connected, current may flow through the ground from the load 120 to the power source 104 and may generate an electric field within the ground that may cause an electrical hazard for personnel. In one embodiment, the ground monitor apparatus 102 helps to ensure that the equipment grounding conductor 118 is properly connected and functioning.

Ground monitoring using a ground monitor apparatus 102 is often required or otherwise utilized in mining due to potentially hazardous conditions in a mine. For example, many mines have water, which is a hazard for electrical equipment. In addition, heavy mining equipment requires a relatively large amount of electrical power and may also be mobile so that conductors feeding the mining equipment are flexible and exposed. Conductors feeding mining equipment may be in rigid conduit, but may also be in flexible conduit and/or covered with a protective sheath. Conductors, including the equipment grounding conductor 118 may be damaged during mining operations.

Equipment grounding conductors 118, which are also called a safety ground, are typically included for safety and are bonded to equipment housings and other metallic components in equipment to provide a low impedance path for short circuit current. Often equipment grounding conductors 118 include a green covering or are bare. While typical short circuit protection, imbalanced load protection, and other protective relaying techniques may be used to protect phase conductors 110, 112, 114, damage to an equipment grounding conductor 118 may go undetected because typically a significant amount of current is not flowing in an equipment grounding conductor 118. When a short occurs, often current flows in the equipment grounding conductor 118. However, if the equipment grounding conductor 118 is damaged, current then flows through other pathways, including through a person. Thus, ground monitoring to verify continuity in an equipment grounding conductor 118 improves safety. For example, continuity of the equipment grounding conductor 118 includes a short circuit, a partial short circuit, an open circuit, or a partial open circuit where resistance of the equipment grounding conductor 118 is not within a specific range. For example, where resistance increases, dangerous levels of current may flow in a different path than the equipment grounding conductor 118. Measuring current in the equipment grounding conductor 118 as compared to an injected signal provides a way to determine if the equipment grounding conductor 118 is shorted, opened, etc., which creates a dangerous situation to personnel.

In one embodiment, the ground monitor apparatus 102 injects a signal into the equipment grounding conductor 118 to sense an undesirable condition, such as a high impedance within the equipment grounding conductor 118, a short between the pilot conductor 122 and ground, or other failure in the equipment grounding conductor 118 or in the ground monitor apparatus 102 and associated components.

In one embodiment, the pilot conductor 122 connects the ground monitor apparatus 102 to the PWD 124 located in the load 120. The PWD 124, in one embodiment, includes one or more diodes, and the pilot conductor 122 is wired to the diodes. A terminal of the PWD 124 may be wired to a chassis ground of the load 120. The equipment grounding conductor 118, in one embodiment, is also connected to the chassis ground of the load 120. In one embodiment, the ground monitor apparatus 102 connects an alternating current ("AC") source to the pilot conductor 122. The AC source injects a continuity signal at a particular test frequency. The PWD 124 may provide a voltage drop which may be used by the ground monitor apparatus 102 to determine a grounding problem. If the PWD 124 fails short or if the pilot conductor 122 is shorted to ground, the current signal changes and the ground monitor apparatus 102 is able to detect the change and open the relay 108.

In an alternate embodiment, the load 120 does not include a pilot wire device ("PWD") 124 with a diode and the pilot conductor 122 connects to chassis ground of the load 120 and to the equipment grounding conductor 118. In the embodiment, the ground monitor apparatus 102 may use a different current sensing scheme than where the PWD 124 with a diode is included. In another embodiment, a DC voltage source injects current into the pilot conductor 122 and the load does not include a PWD 124 with a diode. In another embodiment, a DC voltage source injects current into the pilot conductor 122 and the load includes a PWD 124 with a diode. In the embodiment, the diode in the PWD 124 may be a Zener diode with the pilot conductor 122 connected to the cathode the equipment grounding conductor 118 connected to the anode of the Zener diode.

In one embodiment, the power source 104 includes a ground wire device ("GWD") 126. The GWD 126, in one embodiment, includes a return current sensor 128. In one example, the return current sensor 128 includes a current transformer that senses current in the equipment grounding conductor 118. In another example, the equipment grounding conductor 118 is connected to back to back diodes within the GWD 126, and the back-to-back diodes are also connected to the chassis ground of the power source 104. The back-to-back diodes, in some embodiments, provide some signal isolation for monitoring injected signal in the equipment grounding conductor 118 from the pilot conductor 122. In addition, the back-to-back diodes in the GWD 126 help to keep any voltage on the equipment grounding conductor 118 to within a diode drop of the chassis ground. In another embodiment, a saturable coil may replace the back-to-back diodes.

The saturable coil, in one embodiment, may help keep voltage on the equipment grounding conductor 118 within a saturation voltage of the chassis ground. In another embodiment, the GWD 126 is not included and the equipment grounding conductor 118 is connected to chassis ground of the power source 104. In another embodiment, the power source 103 does not include a GWD 126 and the equipment grounding conductor 118 is connected to chassis ground of the power source 104. For example, the return current sensor 128 may be external to the power source 104. One skilled in the art will recognize that various other methods exist that can help limit the voltage potential between the equipment grounding conductor 118 and the chassis ground, while providing some signal isolation for monitoring injected signal in the equipment grounding conductor 118. In one embodiment, the system 100 includes a watchdog apparatus (not shown) in the ground monitor apparatus 102. The watchdog apparatus, in one embodiment, determines if the ground monitor apparatus 102 is functioning properly.

Figure 1B:
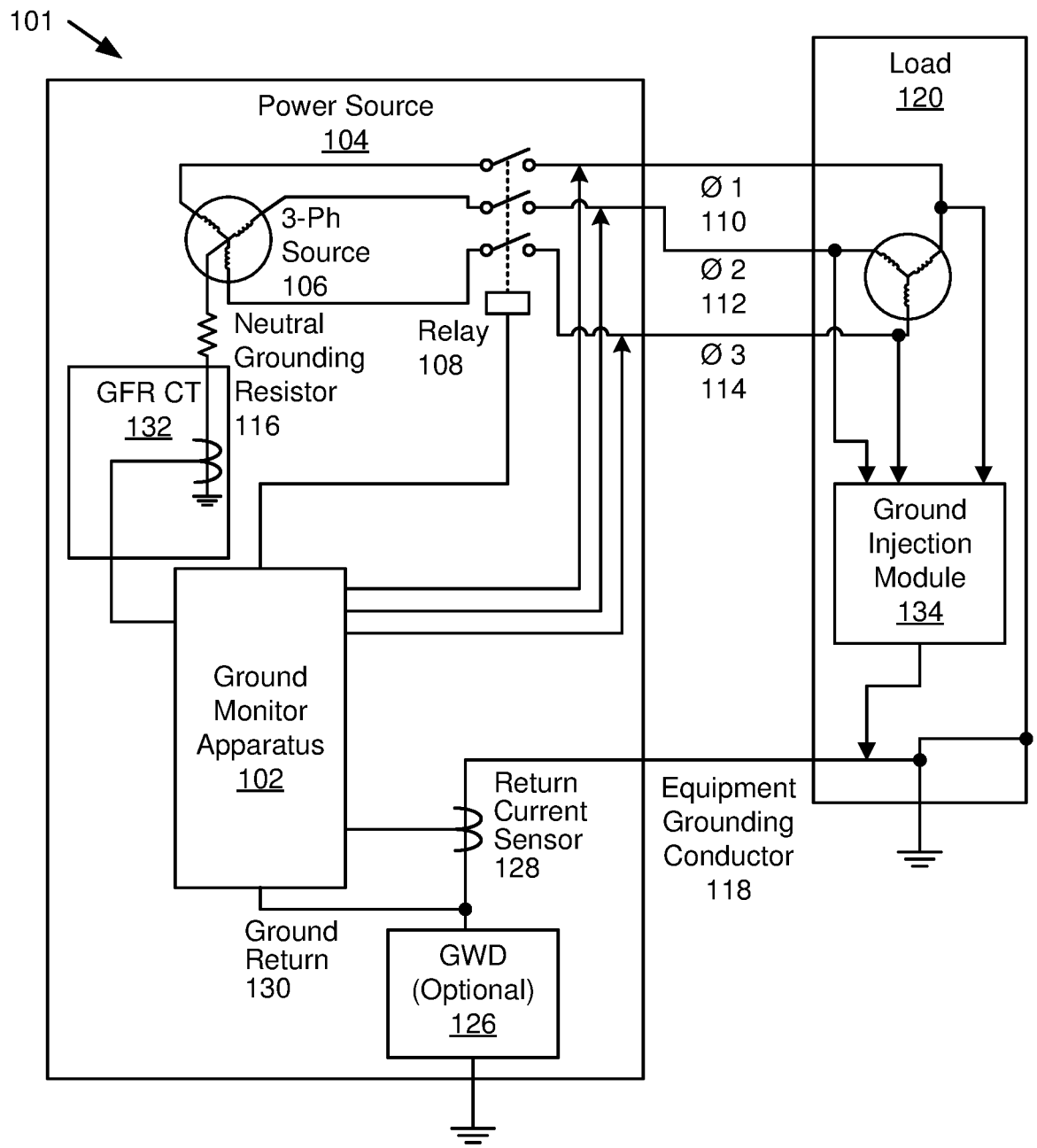
FIG. 1B is a schematic block diagram illustrating one embodiment of a system with a ground monitor apparatus that injects a continuity signal in an equipment grounding conductor over one or more phase conductors.

FIG. 1B is a schematic block diagram illustrating one embodiment of a system 101 with a ground monitor apparatus 102 that injects a continuity signal in an equipment grounding conductor 118 over one or more phase conductors 110, 112, 114. The system 101 includes a ground monitor apparatus 102, a power source 104, a three-phase power source 106, a relay 108, a first phase 110, a second phase 112, a third phase 114, a neutral grounding resistor 116, an equipment grounding conductor 118, a load 120 with a ground injection module 134, a ground wire device ("GWD") 126 with a return current sensor 128, and a ground return 130 and a ground fault relay ("GFR") current transformer ("CT") 132. The components 102-132 of the system 101 of FIG. 1B are substantially similar to those described above in relation to the system 100 of FIG. 1A except no pilot conductor 122 is included. In the system 101 of FIG. 1B, the ground monitor apparatus 102 injects one or more continuity signals on the phase conductors 110, 112, 114 and the ground injection module 134 filters the continuity signals from the phase conductors 110, 112, 114 and injects the continuity signals onto the equipment grounding conductor 118. In the embodiment, the ground monitor apparatus 102 may be called a tone monitor and the one or more continuity signals may be in the audible frequency range.

In the embodiments depicted in the systems 100, 101 of FIGS. 1A and 1B, the ground monitor apparatuses 102 perform the same function of determining continuity of the equipment grounding conductor 118, but also include a frequency testing and a test frequency selection feature, which improves safety by reducing interference from other ground monitor apparatuses 102 and other equipment that may influence continuity monitoring of the equipment grounding conductor 118. The frequency testing and test frequency selection features are described in further detail below with regards to the apparatuses 200, 201, 300, 400 of FIGS. 2A, 2B, 3 and 4.

Figure 2A:
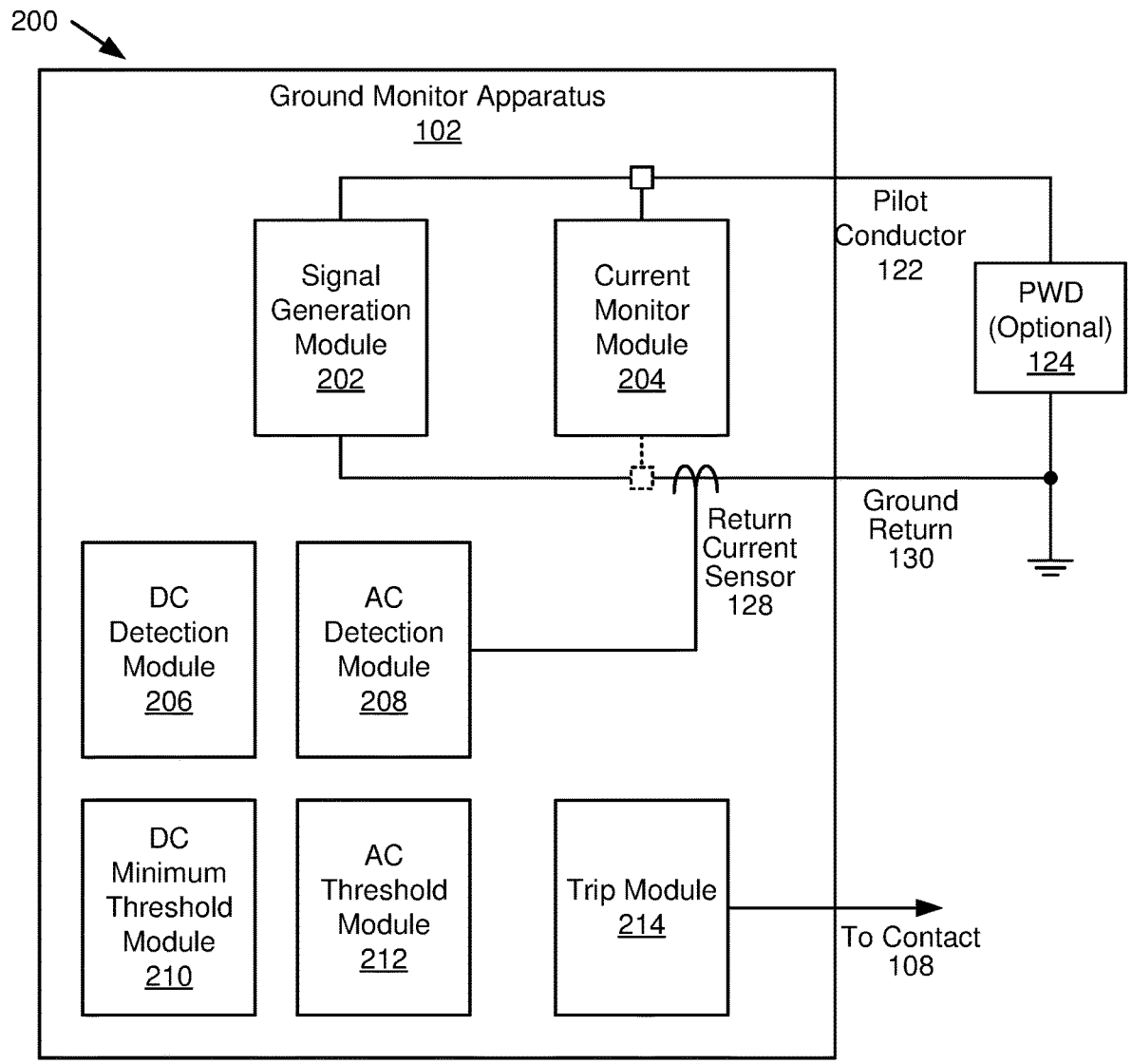
FIG. 2A is a schematic block diagram illustrating one embodiment of a ground monitor apparatus that injects a continuity signal in an equipment grounding conductor over a pilot conductor.

FIG. 2A is a schematic block diagram illustrating one embodiment of a ground monitor apparatus 200 that injects a continuity signal in an equipment grounding conductor over a pilot conductor 122. The apparatus 200 includes a pilot conductor 122, a ground return 130, and a connection to a contact of a relay 108, which are substantially similar to those described above in relation to the system 100 of FIG. 1A. The apparatus 200 includes one embodiment of a ground monitor apparatus 102 with a signal generation module 202, a current monitor module 204, a direct current ("DC") detection module 206, an alternating current ("AC") detection module 208, a DC minimum threshold module 210, an AC threshold module 212, and a trip module 214, which are described below.

The apparatus 200 includes an embodiment of a signal generation module 202 that that injects a continuity signal in the pilot conductor 122. In one embodiment, the signal generation module 202 connects to the pilot conductor 122 and ground return 130. The continuity signal generated by the signal generation module 202 includes a DC component and one or more AC components/continuity signals, which may also be called continuity signals. The DC component may include a DC voltage that is higher than a peak voltage of the one or more AC components/continuity signals. For example, if an AC component includes a sinusoidal waveform with a peak voltage of 5 volts ("V"), the DC component may be 7 V. In another embodiment, the DC component is zero volts or substantially zero volts. For example, the DC component may be 0.1 V, 0.5 V, or other voltage that is substantially zero or close to zero or a voltage substantially less than a peak voltage of an AC component.

Each AC component of the one or more AC components/continuity signals includes a frequency different from other AC components/continuity signals of the one or more AC components/continuity signals. Current in the pilot conductor 122 is injected in the equipment grounding conductor 118 of the set of power cables connecting the power source 104 to the load 120 and the equipment grounding conductor 118 of the set of power cables is connected to the ground return 130. In one embodiment, the one or more AC components/continuity signals are sinusoidal waveforms of different frequencies. In one embodiment, the one or more AC components/continuity signals are three AC components of different frequencies. In another embodiment, four or more AC components/continuity signals are generated by the signal generation module 202.

In one embodiment, each of the AC components/continuity signals generated by the signal generation module 202 has a fundamental frequency that is not a harmonic of the fundamental frequency of an AC voltage generated by the power source 104. For example, the fundamental frequency of the power transmitted by the power source 104 may be 60 hertz ("Hz") for a typical power system found in the United States and other countries or 50 Hz as found in Europe or other countries. In other examples, the power source 104 may generate 120 Hz, 400 Hz, etc. Where the power source 104 produces power at 60 Hz, the AC components/continuity signals generated by the signal generation module 202 may be 85 Hz, 208 Hz, and 990 Hz, which are not harmonic frequencies of 60 Hz. In one embodiment, the AC components/continuity signals have a fundamental frequency that differs significantly from harmonic frequencies of the fundamental frequency of the power source 104.

In some embodiments, the signal generation module 202 limits each AC component/continuity signal is limited to a range. For example, a first continuity signal may be an AC component within a range of 70-200 Hz, a second continuity signal may have a range of 200-500 Hz and a third continuity signal may have a range of 500 Hz to 1.5 kilohertz ("kHz"). The signal generation module 202, in other embodiments with a tone monitor, such as the system 101 of FIG. 1B may include different frequency ranges or separate discrete frequencies.

The apparatus 200 includes, in one embodiment, a current monitor module 204 that monitors current in at least the pilot conductor 122 or the ground return 130 or both. For example, the current monitor module 204 may monitor current in the pilot conductor 122. In another embodiment, the current monitor module 204 monitors current in the ground return 130. In one embodiment, in normal situations current in the pilot conductor 122 is substantially the same as current in the ground return 130. In another embodiment, the current monitor module 204 monitors current in both the pilot conductor 122 and ground return 130, for example, for redundancy. The current monitor module 204 may use a Hall Effect current sensor, a current transformer, a resistor, or other current sensing method known to those of skill in the art. In one embodiment, the current monitor module 204 includes current sensing capable of monitoring AC and DC current. In one embodiment, the current monitor module 204 creates a voltage or a digital value stored in a digital register representative of current in the pilot conductor 122 or ground return 130. When referring to current monitored by the current monitor module 204, one of skill in the art will recognize that the current monitor module 204 may use a voltage signal and modules using the current monitored by the current monitor module 204 may use one or more voltage signals representing current in the pilot conductor 122/ground return 130. Thus, the current monitor module 204 includes a capability to monitor the DC component and the one or more AC components/continuity signals.

The apparatus 200, in one embodiment, includes a DC detection module 206 that determines a DC current present in the current monitored by the current monitor module 204 and an AC detection module 208 that determines an AC current corresponding to each frequency of the one or more AC components/continuity signals present in the current monitored by the current monitor module 204. For example, the DC detection module 206 may determine a DC current present in the pilot conductor 122 or ground return 130. In one embodiment, the DC detection module 206 includes filtering to filter DC current from the current monitored by the current monitor module 204. For example, the DC detection module 206 may include a low pass filter that substantially removes AC content from the current monitored by the current monitor module 204. One of skill in the art will recognize other ways for the DC detection module 206 to determine DC current present in the current monitored by the current monitor module 204.

In one embodiment, The AC detection module 208 determines an AC current corresponding to each frequency of the one or more AC components present in the current monitored by the current monitor module 204 by filtering the DC component from the monitored current and detecting each frequency separately. For example, the AC detection module 208 may include filters to determine each frequency. In one embodiment, the AC detection module 208 uses one or more comb filters tuned to the frequencies of the AC components or to the frequency of the power supply. For example, when trying isolate a first AC component, a comb filter may be tuned to the other AC components so they do not interfere with the AC component being isolated. In another embodiment, the AC detection module 208 uses one or more band pass filters that pass the frequencies of the AC components while eliminating other frequencies. In another embodiment, the AC detection module 208 uses one or more notch filters. In another embodiment, the AC detection module 208 uses a combination of the above mentioned filters. For example, the AC detection module 208 may use a comb filter tuned to each frequency of the AC components and may then include band pass filters and notch filters to further isolate the frequencies of the AC components. Resulting waveforms may then have a specific amplitude for each. One of skill in the art will recognize other ways for the AC detection module 208 to determine an AC current, which may be represented as a voltage, corresponding to each frequency of the one or more AC components.

The apparatus 200, in one embodiment, includes a DC minimum threshold module 210 that determines if the DC current is below a DC current minimum threshold. For example, the DC minimum threshold module 210 may include a comparator that compares the DC current determined by the DC detection module 206 with a DC current minimum threshold. The DC minimum threshold module 210 may use other circuits as well to determine if the DC current is below a DC current minimum threshold. In another embodiment, the DC minimum threshold module 210 may include redundant circuitry and may determine if the DC current is below a first DC current minimum threshold and a second DC current minimum threshold. The first and the second DC minimum thresholds may be the same or different. Redundancy may be used to increase reliability.

In one embodiment, the DC current minimum threshold corresponds to a combined pilot conductor 122 and equipment grounding conductor 118 resistance of less than 50 ohms. In another embodiment, the DC current minimum threshold corresponds to a combined pilot conductor 122, equipment grounding conductor 118, and ground return 130 resistance of less than 50 ohms. Fifty ohms corresponds to an MSHA requirement and the DC current minimum threshold may be set to correspond to 50 ohms or less. For example, if the DC component is a particular voltage, the DC current minimum threshold may correspond to the DC component voltage divided by 50 ohms or a lower resistance.

In one embodiment, the trip module 214 opens the contact 108 when the DC current is below the DC minimum current threshold such that if resistance of the pilot conductor 122, equipment grounding conductor 118, and ground return exceeds a value of 50 ohms or some resistance value just under 50 ohms, the trip module 214 opens the contact 108. A first DC current minimum threshold may correspond to 45 ohms and a second DC current minimum threshold may correspond to 48 ohms.

The apparatus 200, in one embodiment, includes a DC maximum threshold module (not shown) that determines if the DC current, determined by the DC detection module 206, is above a DC current maximum threshold. In one embodiment, the trip module 214 also opens the contact 108 in response to the DC maximum threshold module determining that the DC current is above the DC maximum current threshold. In some circumstances, the grounding conductor 118 or other circuit of the system 100 may include stray DC voltage and/or current that may increase the DC current component of the current in the pilot conductor 122 or ground return 130 monitored by the current monitor module 204 and the DC detection module 206 may determine that the DC current is above a DC current maximum threshold. In one example, the DC current maximum threshold is set at a level that corresponds to a current that is above a DC current in the pilot conductor 122 or ground return 130 that is at a level indicative of an operating condition without a stray DC current component.

In another embodiment, the apparatus 200 includes an AC threshold module 212 that determines if one or more of the AC currents of the continuity signals determined by the AC detection module is below an AC threshold. For example, an AC threshold may correspond to a resistance of the equipment grounding conductor 118 being below a certain resistance. In one embodiment, the AC threshold module 212 uses a single AC threshold for each AC current corresponding to an AC component/continuity signal. In another embodiment, the AC threshold module 212 uses a different AC threshold for each AC current corresponding to an AC component/continuity signal. Note that some of the AC thresholds for the AC currents for the various AC components may be the same.

In one embodiment, the AC threshold module 212 uses a peak current to compare to an AC threshold. In another embodiment, the AC threshold module 212 uses a root-mean-square ("RMS") of the current to compare to an AC threshold. The AC threshold module 212 may use one or more comparators or circuits with a similar function to determine if one or more of the AC currents is below one or more AC thresholds. In another embodiment, the AC current may be digitized and the AC threshold module 212 may digitally compare one or more of the AC currents to one or more AC thresholds. In another embodiment, the AC threshold module 212 includes redundant circuitry so that for each current corresponding to an AC component, there are at least two comparators or similar circuitry. One of skill in the art will recognize other ways for the AC threshold module 212 to determine if one or more of the AC currents is below an AC threshold.

The apparatus 200, in one embodiment, includes a trip module 214 that opens a contact 108 in response to the DC minimum threshold module 210 determining that the DC current is below the DC current minimum threshold longer than a DC current minimum time threshold and/or the AC threshold module 212 determining that at least one of the AC currents is below an AC threshold for longer than an AC current time threshold. The contact 108 disconnects the power source 104 from the set of power cables (e.g. 110, 112, 114). Note that use of the phrase "opens a contact 108" may include closing a normally open contact and/or opening a normally closed contact that is part of the relay 108 such that the power source 104 is disconnected from the set of power cables to the load 120.

The DC current minimum time threshold may be zero or substantially zero or may be an appreciable amount of time. For example, the DC current minimum time threshold may be set to zero while a time may elapse between sending a signal and actual opening due to typical circuit delay time while the delay is unintentional. In another embodiment, the DC current minimum time threshold may be set to a value that accounts for transient conditions, motor start times, downstream overcurrent device reaction time, or other delay known to those of skill in the art. Likewise, the AC current time threshold may be zero, substantially zero, or another time and each AC component may have the same or a different AC current time threshold.

In one embodiment, the trip module 214 opens the contact 108 in response to one of the DC minimum threshold module 210 determining that the DC current is below the DC current minimum threshold longer than a DC current minimum time threshold and the AC threshold module 212 determining that an AC current is below an AC threshold for longer than an AC current time threshold. In another embodiment, the trip module 214 opens the contact 108 in response to some combination of the DC minimum threshold module 210 determining that the DC current is below the DC current minimum threshold longer than a DC current minimum time threshold and the AC threshold module 212 determining that at least one or more of the AC currents is below an AC threshold for longer than an AC current time threshold.

In one embodiment, the apparatus 200 includes multiple DC current minimum thresholds and multiple AC current minimum thresholds for each AC component and the trip module 214 reacts differently depending upon which threshold or thresholds are crossed. For example, certain AC or DC current minimum thresholds may cause the trip module 214 to open the contact 108 without any other condition where other AC or DC current minimum thresholds may require some combination of threshold crossings to open. In other embodiments, certain AC or DC current minimum thresholds may merely trigger an alert while others may cause the trip module 214 to open the contact 108.

In one embodiment, the trip module 214 opens the contact 108 in response to the AC threshold module 212 determining that for at least two of the AC currents, an AC current is below an AC threshold for longer than a first AC current time threshold. In a further embodiment, the signal generation module 202 generates three AC components/continuity signals and the trip module 214 further opens the contact 108 in response to the AC threshold module 212 determining that each of the three AC currents is below an AC threshold for longer than a second AC current time threshold. In one embodiment, the first AC current time threshold is longer than the second AC current time threshold. For example, the first AC current time threshold may be 250 milliseconds ("mS") and the second AC current time threshold may be 150 mS.

Figure 2B:
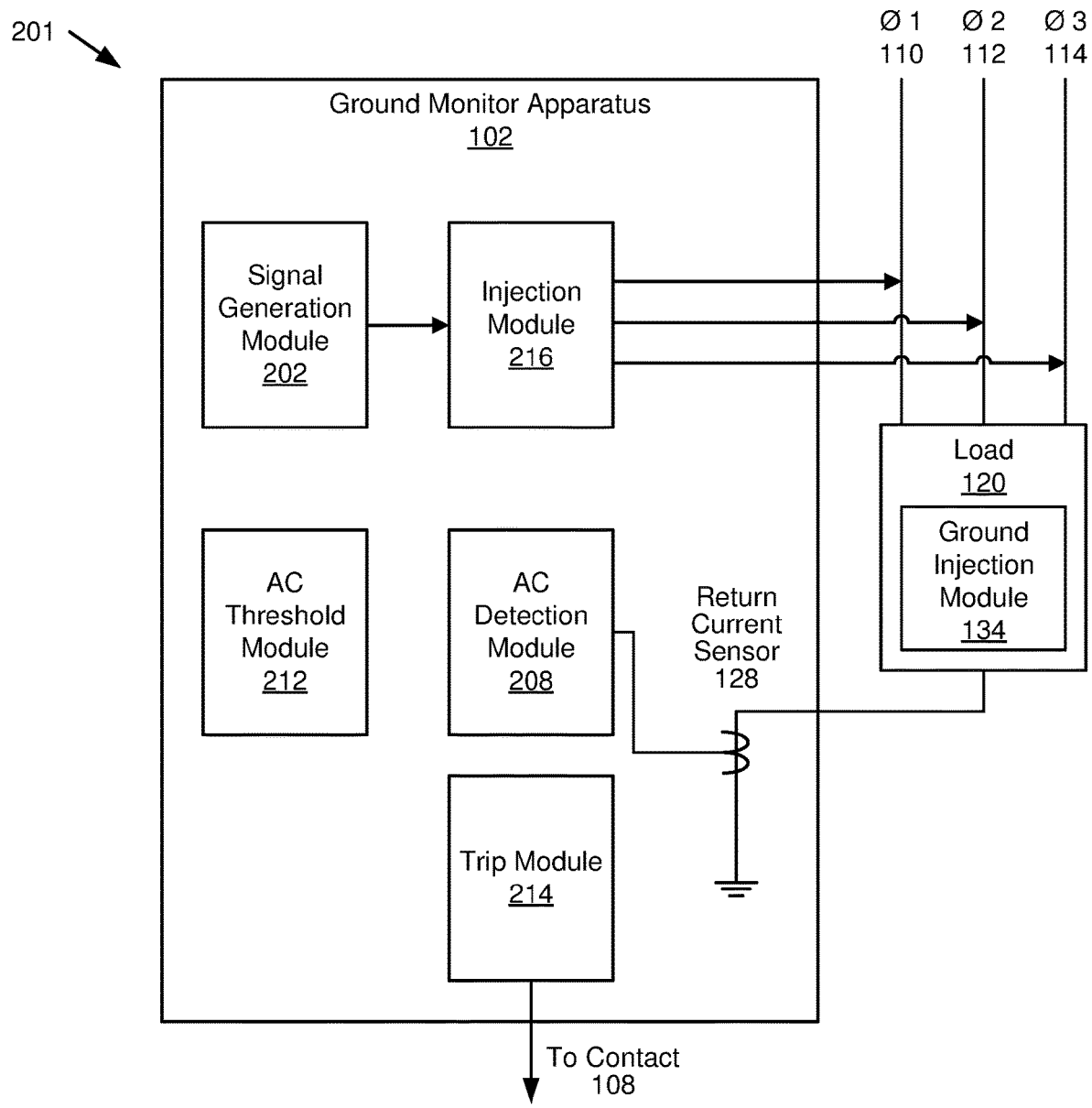
FIG. 2B is a schematic block diagram illustrating one embodiment of a ground monitor apparatus that injects a continuity signal in an equipment grounding conductor over one or more phase conductors.

FIG. 2B is a schematic block diagram illustrating one embodiment of a ground monitor apparatus 201 that injects a continuity signal in an equipment grounding conductor 118 over one or more phase conductors 110, 112, 114. The apparatus 201 includes another embodiment of a ground monitor apparatus 102 with a signal generation module 202, an injection module 216, an AC detection module 208, an AC threshold module 212, a trip module 214, which are described below, along with a first phase 110, a second phase 112, a third phase 114, a load 120 with a ground injection module 134 and a ground current sensor 128, as described above with regard to the system 101 of FIG. 1B.

The apparatus 201, in one embodiment, includes a signal generation module 202 that generates a plurality of alternating current ("AC") components, which are also referred to herein as continuity signals. Each of the plurality of AC components has a different frequency. In one embodiment, the signal generation module 202 is substantially similar to the signal generation module 202 of the apparatus 200 of FIG. 2A, except that the signal generation module 202 of the apparatus 201 of FIG. 2B does not generate a DC signal.

In one embodiment, each AC component/continuity signal is a current signal to be injected in the power cable assembly. In another embodiment, each AC component is a voltage signal. The amplitude of each AC component, in one embodiment, is high enough to distinguish the AC components from noise that may be present in the system 100 and low enough to meet safety standards and to not interfere with power generated by the power source 104.

The plurality of AC components includes at least one AC component/continuity signal, but may include three, four or more AC components/continuity signals. More than one AC components/continuity signals help to increase confidence that any AC components/continuity signals present on the equipment grounding conductor 118 are intentionally injected and that lack of one or more of the AC components/continuity signals on the equipment grounding conductor 118 at a high enough amplitude indicates that there is a problem with the equipment grounding conductor 118.

The apparatus 201, in one embodiment, includes an injection module 216 that that injects the plurality of AC components/continuity signals on one or more phases 110, 112, 114 of the set of power cables connecting the power source 104 to a load 120. The set of power cables includes the equipment grounding conductor 118 and the AC components/continuity signals are injected in the equipment grounding conductor 118, typically at a location downstream of the power source 104, such as at the load 120. The ground injection module 134 injecting the AC components/continuity signals recovered from the phase conductors 110, 112, 114 at the load 120 or other location remote from the power source 104 is beneficial to help verify integrity of the equipment grounding conductor 118. In a typical embodiment, the set of power cables feeds a single load 120 the AC components recovered from the phase conductors 110, 112, 114 are injected at the load 120.

In other examples, where multiple loads 120 are fed by the set of power cables, injecting the AC components/continuity signals at a load 120 that is most remote from the power source 104 may help to verify integrity of the equipment grounding conductor 118 for each load 120 if the loads 120 in certain configurations, such as the loads 120 are daisy chained together. Other arrangements of loads 120 may be configured so that injection of the AC components/continuity signals recovered from the phase conductors 110, 112, 114 may leave gaps in determining integrity of the equipment grounding conductor 118. One of skill in the art will recognize various configurations of multiple loads 120 where determining integrity of the equipment grounding conductor 118 may be compromised. For example, loads 120 may be arranged to each have a separate set of cables 110, 112, 114, 118 running to each load 120, which may include a separate ground injection module 134 so that the ground monitor apparatus 102 monitors each load 120 separately or multiple ground monitor apparatuses 102 may be used.

In one embodiment, the injection module 216 is in electrical communication with the signal generation module 202 to receive the AC components/continuity signals generated by the signal generation module 202, and may also be located in the ground monitor apparatus 102. The injection module 216, in one embodiment, is in electrical communication with one or more of the phase conductors 110, 112, 114 in or near the power source 104. In one embodiment, the injection module 216 injects each AC component on each phase conductor 110, 112, 114.

In another embodiment, the signal generation module 202 generates three AC components/continuity signals and the injection module 216 injects one AC component on each phase conductor 110, 112, 114 while isolating the other circuitry of the ground monitor apparatus 102 from the high voltages likely to be present on the phase conductors 110, 112, and 114. In one example, the injection module 216 injects the AC components/continuity signals on a single phase conductor (e.g. the first phase 110). In another example, the power source 104 is single phase and the injection module 216 injects the AC components/continuity signals in one or two phase conductors (e.g. 110 and/or 112). Injection of the AC components/continuity signals on multiple phase conductors may increase reliability or may help to ensure that a single break or problem with injecting the AC components/continuity signals does not prevent determining integrity of the equipment grounding conductor 118.

The apparatus 201, in one embodiment, includes an AC detection module 208 that determines an AC current corresponding to each frequency of the one or more AC components/continuity signals present in current in the equipment grounding conductor 118. The AC detection module 208 of the apparatus 201 of FIG. 2B, in some embodiments, is substantially similar to the AC detection module 208 of the apparatus 200 of FIG. 2A. The AC detection module 208 receives a signal from the ground current sensor 128, which detects current in the equipment grounding conductor 118 and uses the signal from the ground current sensor 128 to detect presence or absence of AC current of each AC component/continuity signal. For example, the AC detection module 208 may detect that AC current is not present or that AC currents that correspond to one or more AC components/continuity signals are not present in the equipment grounding conductor 118. In one embodiment, the AC detection module 208 includes the ground current sensor 128 and may be embodied by the ground current sensor 128.

In other embodiments, the AC detection module 208 includes additional components, such as amplifiers, signal conditioners, etc. For example, the AC detection module 208 may include one or more filters that filter out frequencies other than the frequencies of the AC components/continuity signals. In one embodiment, the AC detection module 208 isolates each AC component frequency and determines an amplitude of each AC component. In one embodiment, the AC detection module 208 converts an AC signal of an AC component to a direct current ("DC") voltage representative of the amplitude of the AC current of the AC component. For example, the AC detection module 208 may rectify and filter an AC signal corresponding to an AC component to produce a DC signal representative of the AC component. In another embodiment, the AC detection module 208 determines a root-mean-square ("RMS") voltage or peak voltage of an AC signal corresponding to an AC component. In another embodiment, the AC detection module 208 may be implemented using digital signal techniques, such as Analog-Digital conversion, digital filtering, etc., with a digital signal being produced which represents the amplitude of the AC current of the AC component.

The apparatus 201, in one embodiment, includes an AC threshold module 212 that determines if one or more of the AC currents determined by the AC detection module 208 is below an AC threshold. In some embodiments, the AC threshold module 212 of the apparatus 201 of FIG. 2B is substantially similar to the AC threshold module 212 of the apparatus 200 of FIG. 2A.

The apparatus 201, in one embodiment, includes a trip module 214 that opens a contact 108 in response to the AC threshold module 212 determining that at least one of the AC currents is below an AC threshold. In some embodiments, the trip module 214 of the apparatus 201 of FIG. 2B is substantially similar to the trip module 214 of the apparatus 200 of FIG. 2A.

Figure 3:
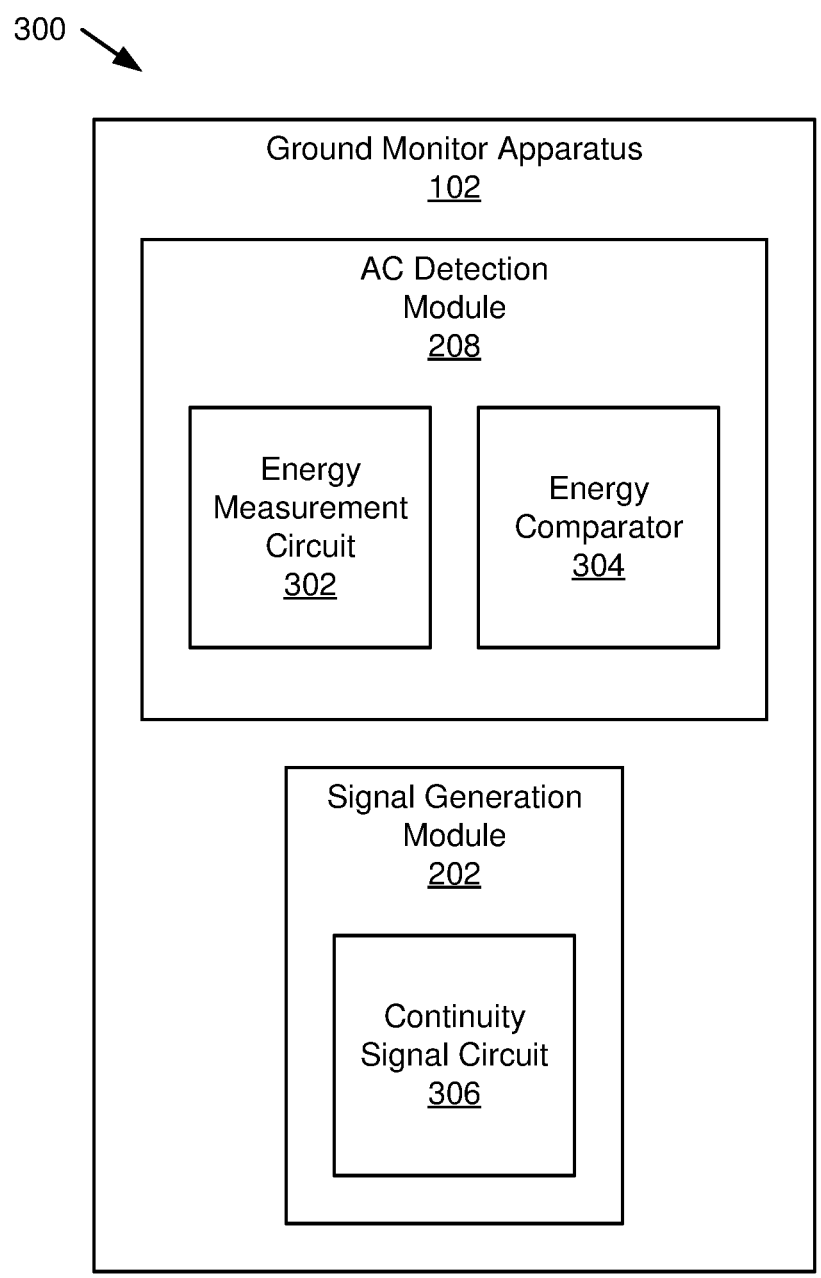
FIG. 3 is a schematic block diagram illustrating an embodiment of a ground monitor apparatus.

FIG. 3 is a schematic block diagram illustrating an embodiment 300 of a ground monitor apparatus 102. In the embodiment, the ground monitor apparatus 102 includes an AC detection module 208 that includes an energy measurement circuit 302 and an energy comparator 304 and a signal generation module 202 that includes a continuity signal circuit 306, which are described below.

The AC detection module 208, in some embodiments, with an energy measurement circuit 302 and an energy comparator 304 include the functionality of the AC detection module 208 described above with regards to the apparatuses 200, 201 of FIGS. 2A and 2B, but also includes additional functionality of the energy measurement circuit 302 and the energy comparator 304, as described below. In addition, the signal generation module 202 that includes a continuity signal circuit 306 includes the functionality of the signal generation module 202 of the apparatuses 200, 201 of FIGS. 2A and 2B, but also includes the functionality of the continuity signal circuit 306, as described below. In other words, the AC detection module 208 and the signal generation module 202 of the apparatuses 200, 201 of FIGS. 2A and 2B, in some embodiments, include the energy measurement circuit 302, the energy comparator 304 and the continuity signal circuit 306.

The energy measurement circuit 302, in some embodiments, measures an energy level at a test frequency in the equipment grounding conductor 118 between the load 120 and the power source 104. The energy measurement circuit 302 operates when the continuity signal with an AC component operating at the test frequency is shut off so that the energy measurement circuit 302 measures the energy level at the test frequency to determine if energy is present in the equipment grounding conductor 118 at the test frequency that would interfere with the continuity signal. For example, energy at the test frequency may be present due to interference from another ground monitor apparatus 102, from the load 120, or from some other source.

In some embodiments, the energy measurement circuit 302 measures current at the test frequency in the equipment grounding conductor 118. For example, the energy measurement circuit 302 may use the return current sensor 128 to measure current. In the embodiment, the current may be equated to energy where the AC detection module 208 uses current to determine whether or not to take action. In other embodiments, the energy measurement circuit 302 measures voltage where a voltage is measured by the AC detection module 208. The energy measurement circuit 302 helps to determine if there is energy present at the test frequency in the equipment grounding conductor 118 for whatever measurement type, e.g. current, voltage, etc., is used by the ground monitor apparatus 102 detect an AC component of a continuity signal for taking action to possibly trip the contacts 108.

The energy comparator 304, in some embodiments, compares the measured energy level with an energy threshold. For example, where the continuity signal is on the order of 0.2 amperes ("A"), the energy threshold might be 0.02 A or other amperes where there is a sufficient difference between the energy level measured by the energy measurement circuit 302 and the energy threshold so that energy in the equipment grounding conductor 118 at the test frequency would not interfere with determining if the continuity signal has dropped below the AC threshold. In some embodiments, the energy comparator 304 compares the measured energy level with multiple energy thresholds. For example, the energy thresholds may be 30%, 70% and 90% below an energy level of the continuity signal and each energy threshold may be used for a different purpose. In some embodiments, the energy comparator 304 uses same measurement circuitry as the AC threshold module 212 where various energy thresholds and AC thresholds may be used to turn on a green light, a yellow light, a red light, to send a trip signal to the trip module 214 and to be used as described below for the continuity signal circuit 306.

Where the energy comparator 304 is used to verify that energy levels at a test frequency are sufficiently low to not interfere with a continuity signal at the test frequency, the energy threshold is set to ensure that there is an adequate amount of difference between an expected energy level of the continuity signal and the energy threshold. A 60 decibel ("dB") drop (i.e. 1000 times less than the continuity signal) would be ideal, but may not be achievable, but a 40 dB drop (i.e. 100 times less than the continuity signal) is desired. A 20 dB drop (10 times less than the continuity signal) may be acceptable in some circumstances. For example, for a 0.2 V continuity signal, a 0.02 V energy threshold may be acceptable. An energy threshold much higher than 20 dB below the continuity signal energy level would be more difficult because the AC threshold module 212 is looking for a drop in energy of the continuity signal/AC component to signal a loss of continuity and energy at the test frequency due to noise begins to interfere with operation of the AC threshold module 212. Typically, a 40-50 dB drop in energy levels with and without the continuity signal is achievable so setting an energy threshold somewhere above about 40 dB and below about 20 dB is adequate.

The ground monitor apparatus 102, in the embodiment, includes the continuity signal circuit 306 that injects a continuity signal comprising a frequency at the test frequency in the equipment grounding conductor 118 at an energy level above the energy threshold in response to the energy comparator 304 determining that the measured energy level is below the energy threshold. The continuity signal is an indicator for continuity of the equipment grounding conductor 118 between the power source 104 and load 120. Advantageously, the energy measurement circuit 302 measuring background energy at the test frequency before the continuity signal circuit 306 turns on the continuity signal (i.e. AC component) improves safety by verifying that there is enough of a difference between background noise at the test frequency and the continuity signal at the test frequency so when the continuity signal drops below the AC threshold, background noise won't affect detection of the drop in energy of the continuity signal. In some embodiments, the continuity signal circuit 306 is part of the signal generation module 202 and controls turn on of AC components/continuity signals after action by the energy measurement circuit 302 and the energy comparator 304.

Figure 4:
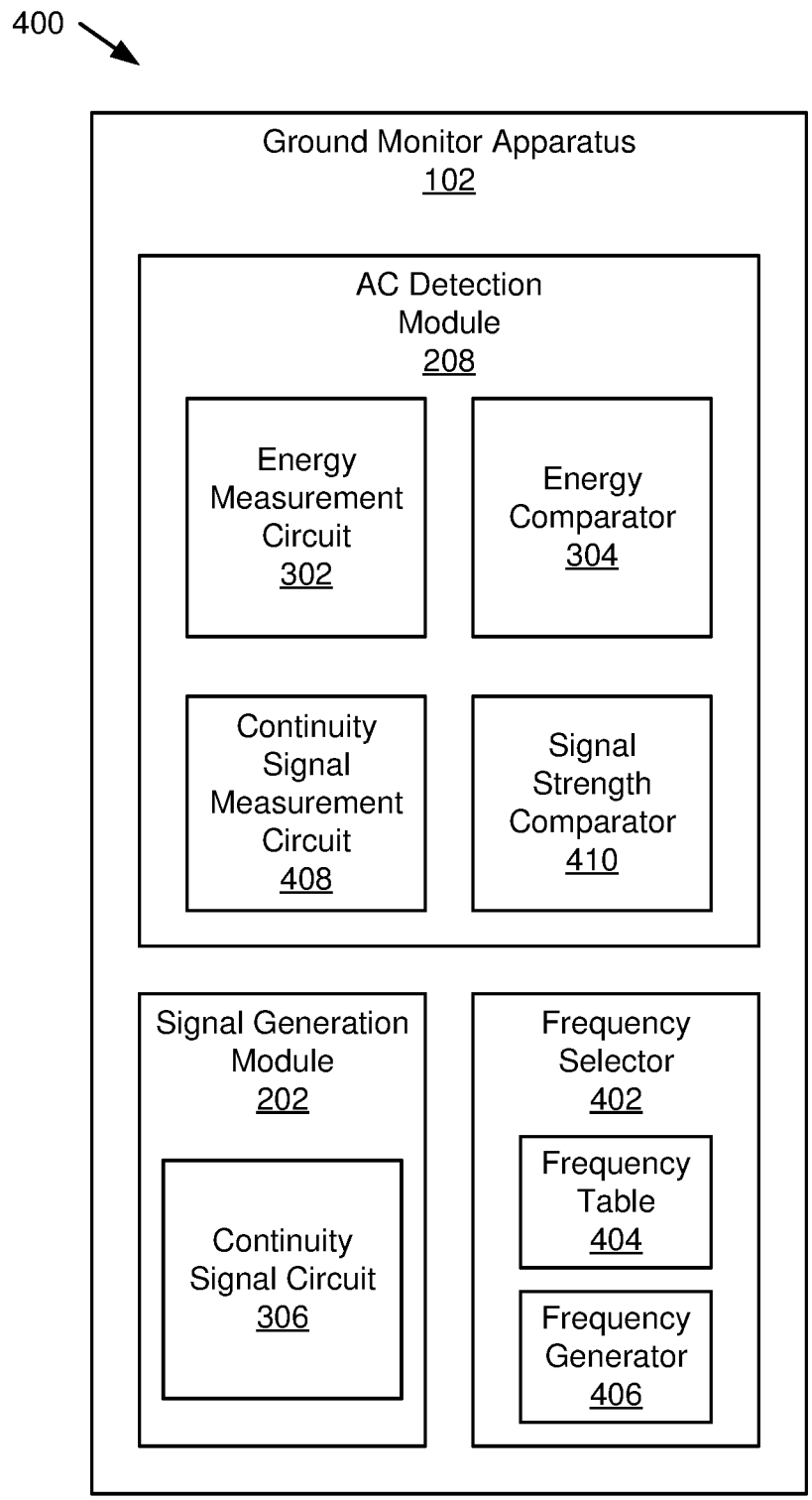
FIG. 4 is a schematic block diagram illustrating another embodiment of a ground monitor apparatus.

FIG. 4 is a schematic block diagram illustrating another embodiment 400 of a ground monitor apparatus 102. In the embodiment, the ground monitor apparatus 102 includes an AC detection module 208 that includes an energy measurement circuit 302 and an energy comparator 304 and a signal generation module 202 that includes a continuity signal circuit 306, which are substantially similar to those described above in relation to the embodiment 300 of the ground monitor apparatus 102 of FIG. 3. In various embodiments, the ground monitor apparatus 102 includes a frequency selector 402 with a frequency table 404 or a frequency generator 406, a continuity signal measurement circuit 408 and a signal strength comparator 410, which are described below.

The AC detection module 208, in some embodiments, with an energy measurement circuit 302, an energy comparator 304, a continuity signal measurement circuit 408 and a signal strength comparator 410 include the functionality of the AC detection module 208 described above with regards to the apparatuses 200, 201 of FIGS. 2A and 2B, but also includes additional functionality of the energy measurement circuit 302, the energy comparator 304, the continuity signal measurement circuit 408 and the signal strength comparator 410, as described below. In addition, the signal generation module 202 that includes a continuity signal circuit 306 includes the functionality of the signal generation module 202 of the apparatuses 200, 201 of FIGS. 2A and 2B, but also includes the functionality of the continuity signal circuit 306, as described below. In other words, the AC detection module 208 and the signal generation module 202 of the apparatuses 200, 201 of FIGS. 2A and 2B, in some embodiments, include the energy measurement circuit 302, the energy comparator 304 and the continuity signal circuit 306. The ground monitor apparatus 102 may include the frequency selector 402 with the frequency table 404 and/or frequency generator 406 separately or combined with the AC detection module 208 and/or signal generation module 202.

In the embodiment 400 of FIG. 4, the ground monitor apparatus 102 includes a frequency selector 402 that selects the test frequency. In some embodiments, the test frequency range is above a fundamental frequency of the power source 104 and excludes harmonics of the fundamental frequency, which helps to prevent interference based the fundamental frequency. In other embodiments, for example with a variable frequency drive ("VFD"), an operating frequency may be above a test frequency and may have harmonics that are close to or at a test frequency. In a situation where the energy comparator 304 determines that the measured energy level from the energy measurement circuit 302 is not below the energy threshold, the frequency selector 402 selects an alternate test frequency. The energy measurement circuit 302 then measures an energy level in the equipment grounding conductor 118 at the alternate test frequency, the energy comparator 304 compares the measured energy level for the alternate test frequency with the energy threshold.

If the measured energy level for the alternate test frequency is below the energy threshold, the continuity signal circuit 306 injects a continuity signal with a frequency at the alternate test frequency in the equipment grounding conductor 118. If the measured energy level is not below the energy threshold, the frequency selector 402 selects another test frequency for evaluation and comparison with the energy threshold. This process continues until a suitable test frequency is found or the frequency selector 402 reaches a frequency limit. For example, the frequency selector 402 may have a frequency limit, which is a finite number of pre-determined test frequencies to try or may have a frequency limit that limits a number test frequencies to try where other test frequencies may be available. If any of the test frequencies that are selected by the frequency selector 402 result in a measured energy level lower than the energy threshold, the continuity signal circuit 306 then injects a continuity signal/AC component matching that successful test frequency.

In some embodiments, the test frequency is selected from frequencies within a test frequency range. Where the signal generation module 202 injects more than one continuity signal, the frequency selector 402, limits test frequencies for each continuity signal to a specific test frequency range where each test frequency range does not overlap other test frequency ranges. For example, as stated above a first continuity signal may be an AC component within a range of 70-200 Hz, a second continuity signal may have a range of 200-500 Hz and a third continuity signal may have a range of 500 Hz to 1.5 kilohertz ("kHz").

The signal generation module 202, in other embodiments with a tone monitor, such as the system 101 of FIG. 1B may include different frequency ranges. For example, a first continuity signal may be an AC component within a range of 70-200 Hz, a second continuity signal may have a range of 100-500 Hz and a third continuity signal may have a range of 500 Hz to 1.5 kilohertz ("kHz"). The signal generation module 202, in other embodiments with a tone monitor, such as the system 101 of FIG. 1B may include different frequency ranges within an overall range of between 1 kHz and 4 kHz. While higher test frequencies may be used, limiting test frequencies below about 5 kHz may beneficially avoid frequency problems that may be encountered at higher frequencies, such as wire inductances, system resonances, etc. In some embodiments, the test frequency ranges are small so that all test frequencies are passed by a single band pass filter. In some embodiments, the test frequency ranges are logarithmically equal. In another embodiment, a first continuity signal may include test frequencies from a first list, a second continuity signal may include test frequencies from a second list, etc. and the frequencies in each list are different. Where different each continuity signal includes a separate list of test frequencies, the lists of test frequencies, in some embodiments, may not be limited to specific frequency ranges but may overlap from a lowest test frequency to a highest test frequency. One of skill in the art will recognize other test frequency ranges and test frequency lists that may be used.

In some embodiments, the frequency selector 402 includes a frequency table 404 that includes a group of pre-selected test frequencies within a test frequency range. Typically, the test frequencies are chosen to avoid harmonics, frequencies that are mathematically related, i.e. harmonics of each other, frequencies known to have energy in the system 100, 101 at the test frequency, etc. For example, prime numbers may be a good choice for test frequencies. Where a system 100, 101 has multiple ground monitor apparatuses 102, the frequency table 404 for each ground monitor apparatus 102 may be populated with different test frequencies. In some embodiments, the frequency selector 402 continues to select frequencies from the frequency table 404 until all frequencies in a test frequency range are selected. In other embodiments, the frequency selector 402 has a frequency limit that is less than the total number of test frequencies in the frequency table 404. The frequency table 404, in some embodiments, includes information for each test frequency sufficient for oscillators and filters to implement a test frequency. For example, a line or entry in the frequency table 404 may correspond to a test frequency and may include coefficients for an oscillator to generate the test frequency and other coefficients for filters to measure energy at the test frequency.

In other embodiments, the frequency selector 402 includes a frequency generator 406 that includes a random frequency generator that selects a random test frequency within a test frequency range. In this instance, the frequency selector 402 may reject some generated random frequencies that are harmonics, frequencies known to have energy, etc. so that the frequency generator 406 may generate another test frequency when a generated test frequency is rejected. In some embodiments, the frequency generator 406 generates test frequencies in an ascending order or a descending order within a test frequency range. Where the frequency selector 402 includes a frequency generator 406, the frequency selector 402, in some embodiments, includes a frequency limit that limits the frequency selector 402 to a finite number of test frequencies to be tried.

A benefit of the frequency table 404 is less circuitry and complexity. However, the test frequencies must be preselected which does not allow for changes in a system 100, 101 that may change energy levels at various frequencies. A benefit of the frequency generator 406 is that more test frequencies within a range would be available, which would allow for changes in the system 100, 101 that change energy levels at various frequencies, but this comes at the expense of increased complexity and processing time, for example in calculating different coefficients for oscillators, filters, etc. In addition, having a random frequency generator may be beneficial for a system 100, 101 with multiple ground monitor apparatuses 102 so that each ground monitor apparatus 102 has a frequency selector 402 generating random frequencies to avoid overlap.

In some embodiments, the ground monitor apparatus 102 includes a continuity signal measurement circuit 408 and a signal strength comparator 410, which may be part of the AC detection module 208 and provide an additional check to ensure a continuity signal is not affected by energy at the test frequency of the continuity signal. The continuity signal measurement circuit 408 measures an energy level at the test frequency in the equipment grounding conductor 118 while the continuity signal circuit 306 injects the continuity signal in the equipment grounding conductor 118 at a particular test frequency that was tested by the energy measurement circuit 302. In some embodiments, the continuity signal measurement circuit 408 uses a voltage level measured just before a continuity signal is turned off for the energy measurement circuit 302 testing.

The signal strength comparator 410 compares the measured energy level measured by the energy measurement circuit 302, with the continuity signal turned off, with the measured energy level measured by the continuity signal measurement circuit 408, while the continuity circuit is turned on, to determine if the difference between the two energy levels is greater than a signal strength delta threshold. Where the signal strength comparator 410 determines that the difference between the measured energy level measured by the energy measurement circuit 302 and the measured energy level measured by the continuity signal measurement circuit 408 is above a signal strength delta threshold and the energy comparator 304 determines that the measured energy level is below the energy threshold, the continuity signal circuit 306 injects the continuity signal in the equipment grounding conductor 118. Where one of these conditions is not met, the frequency selector 402 selects an alternate test frequency and the process starts again to measure energy at the test frequency with and without the continuity signal at the new test frequency. In some embodiments, the energy measurement circuit 302 and continuity measurement circuit 408 use the same circuitry as the AC detection module 208, but measure voltage levels with and without the continuity signal being injected in the equipment grounding conductor 118.

In a system 100, 101 where most of the energy for power delivery is at the fundamental frequency of the power source 104 (i.e. 50 Hz, 60 Hz, etc.) and harmonics of the fundamental frequency, energy levels of the continuity circuits need not be substantial with respect to energy levels generated by the power source 104. For example, the power source 104 may generate voltages of 208 V line-to-line or up to voltages in the kilovolt range so the continuity signals may be around 0.2 A or maybe up to around 1 A. Higher amperages may be used, but may not be beneficial and may increase electrical dangers, component sizes, cost, etc. However, continuity signals must be above expected ambient energy levels so that injected signals are not affected by noise and other interference at a particular test frequency.

In some embodiments, the energy measurement circuit 302 and/or the continuity signal measurement circuit 408 use a band pass filter, comb filters, notch filters, etc. (collectively "filters") as described above with respect to the AC detection module 208. In one embodiment, the filters are fixed and multiple filters are used to cover the possible test frequencies. In other embodiments, the filters are variable and are changed to match a particular test frequency. In some embodiments, the AC detection module 208 includes variable filters for each continuity signal. For example, the AC detection module 208 may include a separate variable comb filter for each continuity signal, may have a different variable notch filter for each continuity signal, etc. A comb filter may filter out certain voltages such as other continuity signals, certain known harmonics, etc. In some embodiments, the filters are analog filters. In other embodiments, the filters are digital filters.

In addition, the signal generation module 202 and/or continuity signal circuit 306 include a variable signal generator capable of generating a continuity signal for each test frequency. Where multiple continuity signals are used, in some embodiments, the signal generator module 202/continuity signal circuit 306 have a variable signal generator for each continuity signal.

In certain embodiments, the energy measurement circuit 302 and energy comparator 304 are used to pick multiple test frequencies at startup. In other embodiments, the energy measurement circuit 302, energy comparator module 304 continuity signal measurement circuit 408 and signal strength comparator 410 are used to pick multiple frequencies at startup. One embodiment of operation at startup is described in relation to the method 600 of FIG. 6.

During operation, the energy measurement circuit 302 and energy comparator 304 are used to verify that a particular test frequency is still valid. In other embodiments, during operation the energy measurement circuit 302, energy comparator 304 continuity signal measurement circuit 408 and signal strength comparator 410 are used to verify that a particular test frequency is valid. One embodiment of test frequency testing during operation is described in relation to the method 700 of FIG. 7. Typically, during operation a single continuity signal is interrupted for testing while other continuity signals are injected and measured. A DC signal may also continue to be injected for a system 100 with a pilot conductor 122. The ground monitor apparatus 102 cycles through each continuity signal during frequency testing.

Frequency testing, in some embodiments, occurs on a schedule. In some embodiments, the frequency testing occurs about every second for three continuity signals, which would allow for about 333 mS per continuity signal. An upper limit may be every 60 S where testing of a particular continuity signal may take much less than 20 S so a test cycle may take on the order of 1 S and the test cycle might be repeated every minute. In other embodiments, a test cycle might in the 3-10 S range. In some embodiments, the frequency testing for a particular continuity signal is short to allow cycling through test frequencies until the frequency limit is reached so that the continuity signal may be flagged as inoperative while other continuity signals are tested.

Thus, frequency testing up to the frequency limit for each continuity signal is less than a trip threshold to allow time to decide to open the relay 108 or not. For example, the ground monitor apparatus 102 may test one continuity signal and find that a suitable test frequency cannot be found. A second continuity signal may then be tested and a suitable test frequency may be found. A third continuity signal is then tested. If a suitable test frequency is found for the third continuity signal, the ground monitor apparatus 102 may send an alert, but because two continuity signals are still operative, the ground monitor apparatus 102 may maintain the relay 108 closed. If the third continuity signal is tested and a suitable test frequency is not found, the ground monitor apparatus 102 may send an alert and may also open the relay 108.

In other embodiments, a single operational continuity signal may be found and the ground monitor apparatus 102 may maintain the relay 108 closed for a particular time before opening. In addition, for systems 100 with a pilot conductor 122, a DC signal may add additional reliability which may allow for less continuity signals to be operational before opening the relay 108. One of skill in the art will recognize other combinations, time limits, etc. and may consider safety standards, such MSHA standards when configuring trip settings based on whether or not various continuity signals pass frequency testing.

Figure 5:
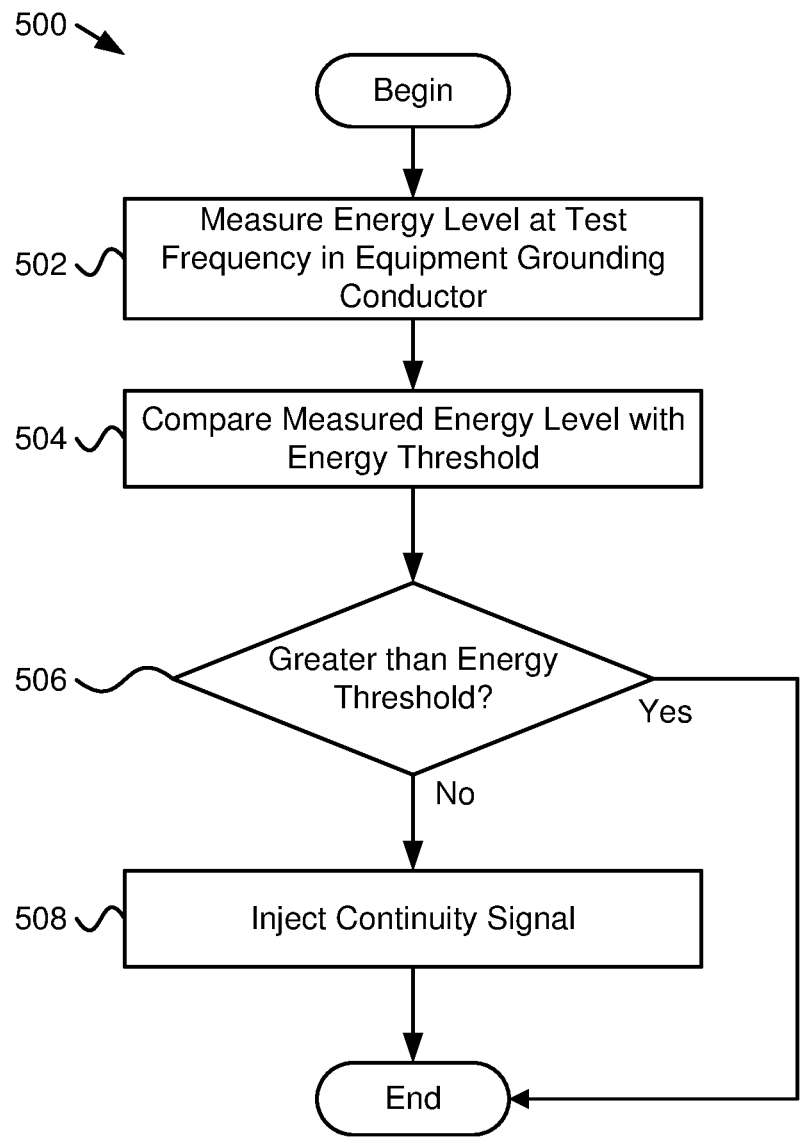
FIG. 5 is a schematic flowchart diagram illustrating one embodiment of a method of determining if energy exists at a test frequency for ground monitoring in a system before injecting the test frequency.

FIG. 5 is a schematic flowchart diagram illustrating one embodiment of a method 500 of determining if energy exists at a test frequency for ground monitoring in a system 100, 101 before injecting the test frequency. The method 500 begins and measures 502 an energy level at a test frequency in an equipment grounding conductor 118 between a load 120 and a power source 104. For example, the energy measurement circuit 302 may measure 502 the energy level while the signal generation module 202 and/or continuity signal circuit 306 pauses injection of a continuity signal at the test frequency. In other embodiments, the energy measurement circuit 302 measures 502 the energy level during a startup operation.

The method 500 compares 504 measured energy level with an energy threshold and determines 506 if the measured energy level is below the energy threshold. If the method 500 determines that the measured energy level is below the energy threshold, the method 500 injects 508 a continuity signal with a frequency at the test frequency in the equipment grounding conductor 118, and the method 500 ends. If the method 500 determines 506 that the measured energy level is not below the energy threshold, the method 500 ends. The energy comparator 304, in some embodiments, compares the measured energy level with the energy threshold and determines 506 if the measured energy level is below the energy threshold. The signal generation module 202 and/or continuity signal circuit 306, in some embodiments, inject 508 the continuity signal in the equipment grounding conductor 118.

Figure 6:
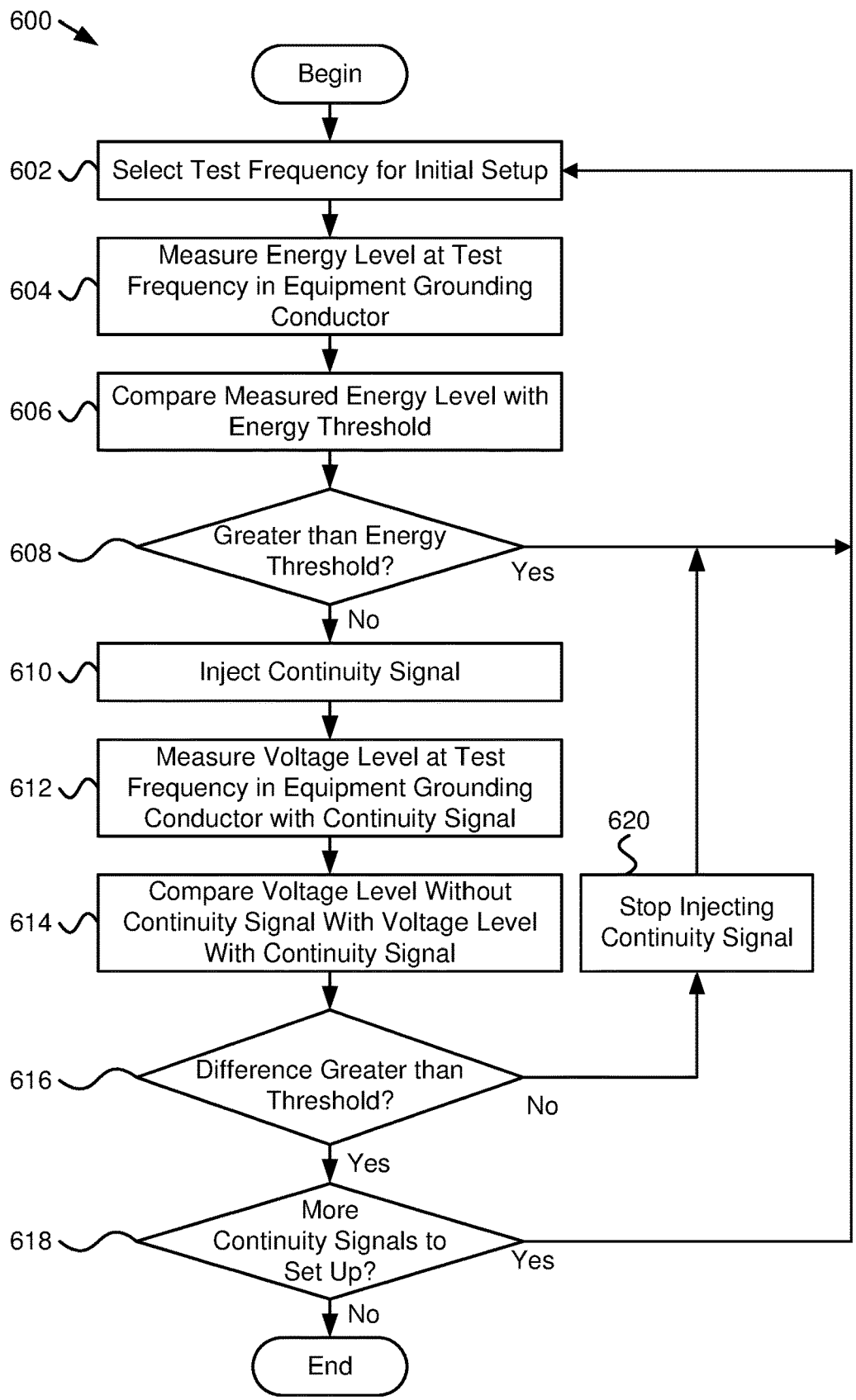
FIG. 6 is a schematic flowchart diagram illustrating one embodiment of a method of determining if energy exists at a test frequency for ground monitoring in a system before injecting a continuity circuit with the test frequency during initial setup.

FIG. 6 is a schematic flowchart diagram illustrating one embodiment of a method 600 of determining if energy exists at a test frequency for ground monitoring in a system 100, 101 before injecting a continuity signal with the test frequency during initial setup. The method 600 begins and selects 602 a test frequency from a test frequency range for a continuity signal during initial setup of a ground monitor apparatus 102. The method 600 measures 604 an energy level at the test frequency in an equipment grounding conductor 118 between the load 120 and the power source 104 and compares 606 the measured energy level with an energy threshold.

The method 600 determines 608 if the measured energy level is greater than the energy threshold. If the method 600 determines 608 that the measured energy level is not greater than the energy threshold, the method 600 injects 610 a continuity signal with the test frequency in the equipment grounding conductor 118 and measures 612 an energy level at the test frequency in the equipment grounding conductor 118 while the continuity signal is injected in the equipment grounding conductor 118. The method 600 compares 614 the measured energy level at the test frequency when the continuity signal was not injected with the measured energy level when the continuity signal with the test frequency is injected and determines 616 if the difference in energy levels is greater than a signal strength delta threshold.

If the method 600 determines that the difference in energy levels is greater than a signal strength delta threshold, the method 600 determines 618 if there are more continuity signals to set up. If the method 600 determines 618 that there are more continuity signals to set up, the method 600 returns and selects 602 a test frequency from a test frequency range corresponding to the next continuity signal. If the method 600 determines 618 that there are no more continuity signals to set up, the method 600 ends.

If the method 600 determines 608 that the measured energy level is greater than the energy threshold, the method 600 returns and selects a different test frequency from the test frequency range for the continuity signal being set up. If the method 600 determines 616 that the difference in energy levels is not greater than a signal strength delta threshold, the method 600 stops 620 injecting the continuity signal being tested and returns and selects a different test frequency from the test frequency range for the continuity signal being set up. If the method 600 runs out of test frequencies for a continuity signal (not shown), the method 600 issues an alert (not shown) and the method 600 ends. Note that steps 612, 614, 616 and 620, in some embodiments, are not practice and the method 600 injects continuity signals based steps 604, 606, and 608. In various embodiments, the method 600 is implemented with one or more of the energy measurement circuit 302, the energy comparator 304, the continuity signal circuit 306, the frequency selector 402, the continuity signal measurement circuit 408, signal strength comparator 410, the AC detection module 208 and the signal generation module 202.

Figure 7:
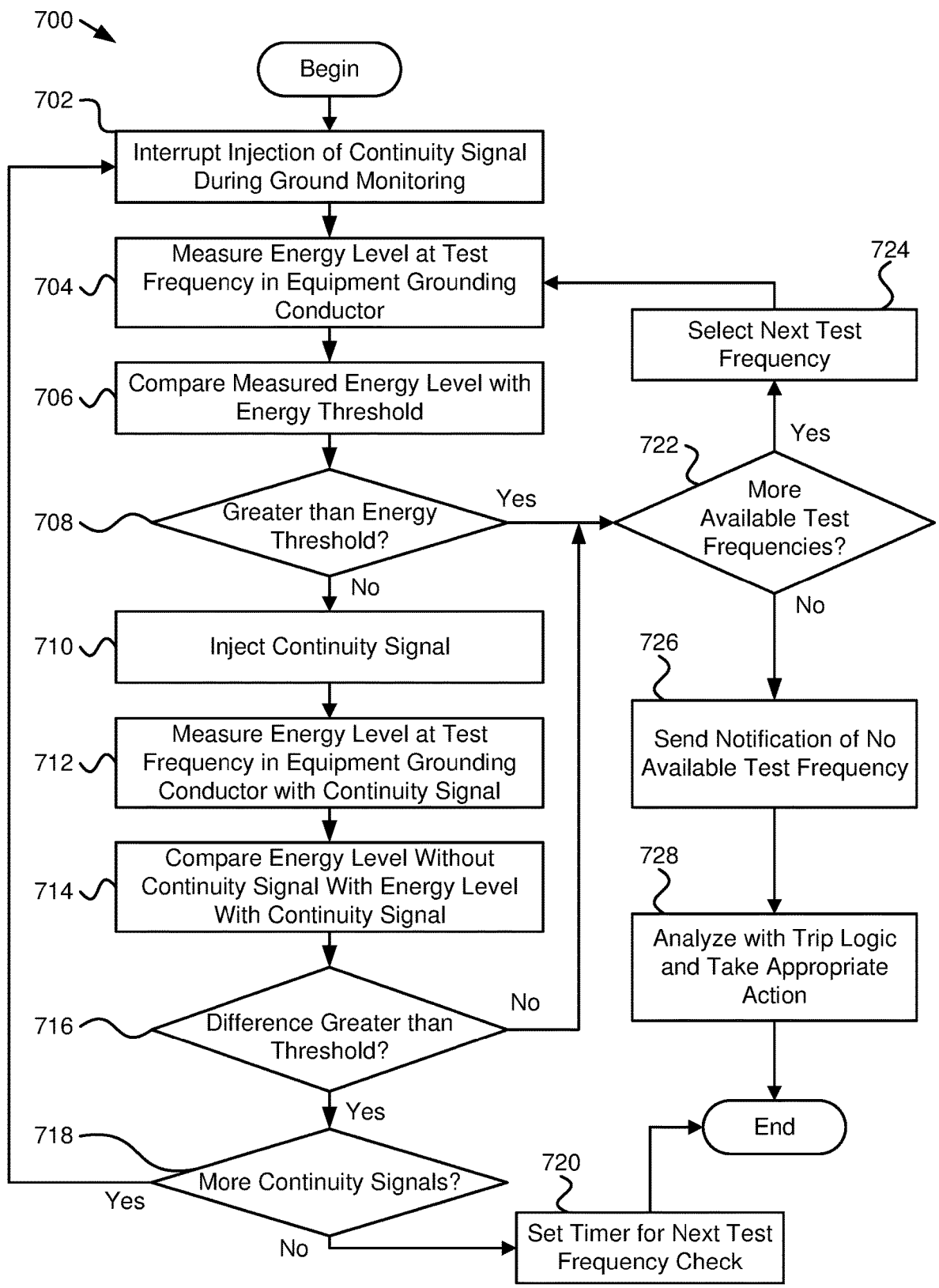
FIG. 7 is a schematic flowchart diagram illustrating one embodiment of a method of determining if energy exists at a test frequency for ground monitoring in a system before injecting a continuity circuit with the test frequency during operation.

FIG. 7 is a schematic flowchart diagram illustrating one embodiment of a method 700 of determining if energy exists at a test frequency for ground monitoring in a system 100, 101 before injecting a continuity signal with the test frequency during operation. The method 700 begins and interrupts 702 injection of a continuity signal in an equipment grounding conductor 118 during ground monitoring where the continuity signal is injected to monitor continuity of the equipment grounding conductor 118 between a source 104 and a load 120. The continuity signal is operating at a particular test frequency. The method 700 measures 704 an energy level at a test frequency in the equipment grounding conductor. In one embodiment, the method 700 measures 704 at the same test frequency as the interrupted continuity signal. In another embodiment, the method 700 measures 704 at a different test frequency.

The method 700 compares 706 the measured energy level at the test frequency with an energy threshold and determines 708 if the measured energy level is greater than the energy threshold. If the method 700 determines 708 that the measured energy level at the test frequency is below the energy threshold, the method 700 injects 710 a continuity signal with the test frequency in the equipment grounding conductor 118 and measures 712 the energy level at the test frequency in the equipment grounding conductor 118 and compares 714 the measured energy level measured without the continuity signal with the measured energy level measured with the continuity signal injected in the equipment grounding conductor 118. In other embodiments, the method 700 uses a voltage level measured before interrupting 702 the continuity signal. However, this variation typically could occur only with interruption of a continuity signal with a first test frequency and typically would not occur when testing subsequent test frequencies if the first test frequency is not suitable for use.

The method 700 determines 716 if the difference between the measured energy level with and without the continuity signal is greater than a signal strength delta threshold. If the method 700 determines 716 that the difference between the measured energy level with and without the continuity signal is greater than a signal strength delta threshold, the method 700 continues to inject the continuity signal and determines 718 if there are additional continuity signals to check. If the method 700 determines 718 that there are additional continuity signals to check, the method 700 returns and interrupts 702 a different continuity signal with a different test frequency and proceeds with testing for energy at the different test frequency.

If the method 700 determines that 718 there are no additional continuity signals to check, the method 700 sets 720 a time for a next test frequency check and the method 700 ends. If the method 700 determines 708 that the measured energy level without the continuity signal is greater than the energy threshold or if the method 700 determines 716 that the difference between the measured energy level with and without the continuity signal is not greater than a signal strength delta threshold, the method 700 determines 722 if there are more available test frequencies (i.e. count is less than the frequency limit or a frequency table 404 has additional frequencies). If the method 700 determines 722 that there are additional test frequencies available, the method 700 selects 724 a next test frequency and returns and measures 704 an energy level at the next test frequency in the equipment grounding conductor 118.

If the method 700 determines 722 that there are no more test frequencies available (i.e. reached frequency limit or no more test frequencies available in the frequency table 404), the method 700 sends 726 a notification of no available test frequencies in a test frequency range corresponding to the interrupted continuity signal, and the method 700 analyzes 728 the notification, using a trip module 214, and takes appropriate action, and the method 700 ends. For example, if the method 700 returns a notification of no available test frequencies for a single continuity signal in a ground monitor apparatus 102 with multiple continuity signals, the trip module 214 may not trip the relay 108, but may send a visible or audible warning that the continuity signal is not functional. In a ground monitor apparatus 102 with a single continuity signal, the trip module 214 may open the relay 108. In a ground monitor apparatus 102 with multiple continuity signals and with multiple notifications of no available test frequencies, the trip module 214 may open the relay 108, may wait for a time and retest the test frequencies of the continuity signals, or other appropriate action.

Note that measurement 712 with the continuity signal injected, comparing the energy level in the equipment grounding conductor with and without the continuity signal and determining 716 if the energy difference is greater than the strength delta threshold, in some embodiments, are not practiced while checking the energy level without the continuity signal in steps 704, 706, and 708 are still included. In other embodiments, the method 700 may be modified to not compare 706 the measured energy level at the test frequency without the injected continuity signal with the energy threshold and to not determine 708 if the measured energy is greater than the energy threshold. In the embodiment, the method 700 still compares 714 the energy levels at the test frequency with and without the continuity signal and injects the continuity signal based on the difference between the measured energy levels with and without the continuity signal. In various embodiments, the method 700 is implemented with one or more of the energy measurement circuit 302, the energy comparator 304, the continuity signal circuit 306, the frequency selector 402, the continuity signal measurement circuit 408, signal strength comparator 410, the AC detection module 208 and the signal generation module 202.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
   a continuity signal circuit that injects a plurality of continuity signals in an equipment grounding conductor between a load and a power source, each continuity signal comprising a frequency within a frequency range, wherein the frequency range of a continuity signal of the plurality of continuity signals does not overlap the frequency range of another continuity signal of the plurality of continuity signals;
   a trip module for controlling opening and closing operations of a relay disposed between the load and the power source;
   an energy measurement circuit that periodically interrupts one continuity signal of the plurality of continuity signals and, during each interruption, measures an energy level at each of at least one test frequency in the equipment grounding conductor between the load and the power source, each test frequency within a test frequency range within the frequency range of the interrupted continuity signal and having a frequency different than the frequency of the interrupted continuity signal; and
   an energy comparator that compares the measured energy level of each of the at least one test frequency with an energy threshold,
   wherein the continuity signal circuit injects a new first continuity signal comprising a frequency at a selected one of the at least one test frequency in the equipment grounding conductor at a signal energy level above the energy threshold in response to the energy comparator determining that the measured energy level of the selected test frequency is below the energy threshold, wherein each of the plurality of continuity signals is an indicator for continuity of the equipment grounding conductor between the power source and load, and
   wherein, in response to a determination by the energy comparator that during more than one interruption none of the at least one test frequency has a measured energy level below the energy threshold, the trip module is controlled to perform one of: send a signal to open the relay, and re-measure an energy level at each of the at least one test frequency after a wait time.

2. The apparatus of claim 1, wherein the energy measurement circuit determines the measured energy level by measuring a current and/or a voltage.

3. The apparatus of claim 1, further comprising a frequency selector that selects the test frequency.

4. The apparatus of claim 3, wherein the frequency selector selects an alternate test frequency in response to the energy comparator determining that the measured energy is not below the energy threshold.

5. The apparatus of claim 4, wherein:
   the energy measurement circuit measures a subsequent energy level in the equipment grounding conductor at the alternate test frequency;
   the energy comparator compares the subsequent measured energy level for the alternate test frequency with the energy threshold; and
   the continuity signal circuit injects the continuity signal comprising the frequency at the alternate test frequency in the equipment grounding conductor at aa second signal energy level above the energy threshold in response to the energy comparator determining that the measured energy level is below the energy threshold.

6. The apparatus of claim 5, wherein the frequency selector, the energy measurement circuit and the energy comparator select additional test frequencies, measure additional energy levels at the additional test frequencies and compare the additional measured energy levels with the energy threshold until one of:
   the energy comparator determines that a one of the additional test frequency is below the energy threshold; and
   the frequency selector reaches a frequency limit, the frequency limit comprises a number of times the frequency selector selects one of the additional test frequency.

7. The apparatus of claim 3, wherein the frequency selector selects a plurality of different test frequencies, wherein each selected test frequency of the plurality of selected test frequency corresponds to one of the plurality of continuity signals.

8. The apparatus of claim 7, wherein the frequency selector selects a test frequency of the plurality of test frequencies from a test frequency range of a plurality of different test frequency ranges, wherein each test frequency range of the plurality of different test frequency ranges does not overlap another test frequency range of the plurality of different test frequency ranges.

9. The apparatus of claim 7, wherein, during a startup operation, for each of the plurality of continuity signals and until a suitable test frequency is found:
   the energy measurement circuit measures a different energy level in the equipment grounding conductor at a test frequency selected by the frequency selector within a test frequency range;
   the energy comparator compares each of the different measured energy levels for the test frequency with the energy threshold;
   the continuity signal circuit injects a continuity signal of the plurality of continuity signals comprising a frequency at the test frequency in the equipment grounding conductor at a signal energy level above the energy threshold in response to the energy comparator determining that the measured energy level is below the energy threshold; and the frequency selector selects a different test frequency within the test frequency range in response to the energy comparator determining that the measured energy level is at or above the energy threshold.

10. The apparatus of claim 3, wherein the frequency selector selects as the test frequency one of:
from a group of pre-selected test frequencies within the test frequency range; and
using a random frequency generator configured to select a random test frequency within the test frequency range.

11. The apparatus of claim 1, further comprising:
a continuity signal measurement circuit that measures a second energy level at the test frequency in the equipment grounding conductor while the continuity signal circuit injects the continuity signal in the equipment grounding conductor; and
a signal strength comparator that compares the measured energy level measured by the energy measurement circuit with the second measured energy level measured by the continuity signal measurement circuit,
wherein the continuity signal circuit injects the continuity signal comprising the frequency at the test frequency in the equipment grounding conductor at the signal energy level above the energy threshold in response to the energy comparator determining that the measured energy level is below the energy threshold and the signal strength comparator determining that an energy difference between the measured energy level measured by the energy measurement circuit and the second measured energy level measured by the continuity signal measurement circuit is above a signal strength delta threshold.

12. The apparatus of claim 1, wherein the energy measurement circuit comprises a band pass filter tuned to the test frequency.

13. The apparatus of claim 1, wherein the continuity signal circuit injects the continuity signal in one of:
a pilot conductor and the equipment grounding conductor run to the load and the continuity signal is injected into the equipment grounding conductor from the pilot conductor; and
a phase conductor providing power to the load and the continuity signal is injected into the equipment grounding conductor from the phase conductor.

14. An apparatus comprising:
a continuity signal circuit that injects a plurality of continuity signals in an equipment grounding conductor between a load and a power source, each continuity signal comprising a frequency within a frequency range, wherein the frequency range of a continuity signal of the plurality of continuity signals does not overlap the frequency range of another continuity signal of the plurality of continuity signals;
a trip module for controlling opening and closing operations of a relay disposed between the load and the power source;
a frequency selector that selects at least one test frequency, each of the at least one test frequency selected from frequencies within a test frequency range, the test frequency range above a fundamental frequency of a power source and excludes harmonics of the fundamental frequency;
an energy measurement circuit that periodically interrupts one continuity signal of the plurality of continuity signals and, during each interruption, measures an energy level at each of the at least one test frequency in the equipment grounding conductor between the load and the power source, each test frequency within a test frequency range within the frequency range of the interrupted continuity signal and having a frequency different than the frequency of the interrupted continuity signal;
an energy comparator that compares the measured energy level of each of the at least one test frequency with an energy threshold,
wherein the continuity signal circuit injects a new first continuity signal comprising a frequency at a selected one of the at least one test frequency in the equipment grounding conductor at a signal energy level above the energy threshold in response to the energy comparator determining that the measured energy level of the selected test frequency is below the energy threshold,
wherein each of the plurality of continuity signals is an indicator for continuity of the equipment grounding conductor between the power source and the load, and
wherein, in response to a determination by the energy comparator that during more than one interruption none of the at least one test frequency has a measured energy level below the energy threshold, the trip module is controlled to perform one of: send a signal to open the relay, and re-measure an energy level at each of the at least one test frequency after a wait time.

15. The apparatus of claim 14, wherein the frequency selector selects an alternate test frequency in response to the energy comparator determining that the measured energy is not below the energy threshold, wherein the energy measurement circuit measures a subsequent energy level, the energy comparator compares the subsequent measured energy level with the energy threshold for the alternate test frequency and the continuity signal circuit injects the continuity signal comprising the alternate test signal in response to the energy comparator determining that the subsequent measured energy level for the alternate test frequency is below the energy threshold.

16. The apparatus of claim 14, wherein the frequency selector selects a plurality of different test frequencies, wherein each selected test frequency of the plurality of selected test frequency corresponds to one of the plurality of continuity signals.

17. A method comprising:
injecting, with a continuity signal circuit, a plurality of continuity signals in an equipment grounding conductor between a load and a power source, each continuity signal comprising a frequency within a frequency range, wherein the frequency range of a continuity signal of the plurality of continuity signals does not overlap the frequency range of another continuity signal of the plurality of continuity signals;
providing a trip module for controlling opening and closing operations of a relay disposed between the load and the power source;
periodically interrupting, with an energy measurement circuit, one continuity signal of the plurality of continuity signals and, during each interruption, measuring, with the energy measurement circuit, an energy level at each of at least one test frequency in the equipment grounding conductor between the load and the power source, each test frequency within a test frequency range within the frequency range of the interrupted continuity signal and having a frequency different than the frequency of the interrupted continuity signal; and comparing, with an energy comparator, the measured energy level of each of the at least one test frequency with an energy threshold, wherein the continuity signal circuit injects a new first continuity signal comprising a frequency at a selected one of the at least one test frequency in the equipment grounding conductor at a signal energy level above the energy threshold in response to the energy comparator determining that the measured energy level of the selected test frequency is below the energy threshold, wherein each of the plurality of continuity signals is an indicator for continuity of the equipment grounding conductor between the power source and the load, and wherein, in response to a determination by the energy comparator that during more than one interruption none of the at least one test frequency has a measured energy level below the energy threshold, controlling the trip module to perform one of: send a signal to open the relay, and re-measure an energy level at each of the at least one test frequency after a wait time.

\* \* \* \* \*